(12) United States Patent
Yamada

(10) Patent No.: US 7,746,690 B2
(45) Date of Patent: Jun. 29, 2010

(54) MEMORY COMPRISING DIODE

(75) Inventor: Kouichi Yamada, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 463 days.

(21) Appl. No.: 11/727,687

(22) Filed: Mar. 28, 2007

(65) Prior Publication Data

US 2007/0242542 A1  Oct. 18, 2007

(30) Foreign Application Priority Data

Mar. 28, 2006 (JP) ............................ 2006-086888
Jan. 30, 2007 (JP) ............................ 2007-018816

(51) Int. Cl.
*G11C 11/36* (2006.01)
(52) U.S. Cl. ................. 365/175; 365/174; 365/103; 365/104; 365/105; 365/115; 365/185.13; 365/243
(58) Field of Classification Search ................ 365/175, 365/174, 103, 104, 105, 115, 185.13, 243
See application file for complete search history.

(56) References Cited

U.S. PATENT DOCUMENTS 5,361,225 A * 11/1994 Ozawa ....................... 365/145

7,317,649 B2 * 1/2008 Kajigaya ..................... 365/222
2005/0205943 A1 9/2005 Yamada
2005/0269646 A1 * 12/2005 Yamada ..................... 257/390
2006/0197115 A1 * 9/2006 Toda .......................... 257/248

FOREIGN PATENT DOCUMENTS

JP    2005-268370 A    9/2005

* cited by examiner

*Primary Examiner*—Van Thu Nguyen
*Assistant Examiner*—Eric Wendler
(74) *Attorney, Agent, or Firm*—McDermott Will & Emery LLP

(57) ABSTRACT

A memory operable at a high speed is obtained. This memory comprises a plurality of word lines, first transistors each connected to each the plurality of word lines for entering an ON-state through selection of the corresponding word line, a plurality of memory cells including diodes having cathodes connected to the source or drain regions of the first transistors respectively and a data determination portion connected to the drain or source regions of the first transistors for determining data read from a selected memory cell.

18 Claims, 11 Drawing Sheets

MEMORY COMPRISING DIODE

BACKGROUND OF THE INVENTION

1. Field of the Invention

The present invention relates to a memory, and more particularly, it relates to a memory comprising memory cells including diodes.

2. Description of the Background Art

Japanese Patent Laying-Open No. 2005-268370 discloses a crosspoint mask ROM (hereinafter referred to as a crosspoint diode ROM) having a plurality of memory cells, each including a diode, arranged in the form of a matrix. This crosspoint diode ROM is generally known as an exemplary memory.

FIG. 11 is a circuit diagram showing the structure of the conventional crosspoint diode ROM disclosed in the aforementioned Japanese Patent Laying-Open No. 2005-268370. Referring to FIG. 11, a plurality of word lines WL and a plurality of bit lines BL are arranged in a memory cell array 101 to intersect with each other in the conventional crosspoint diode ROM. The word lines WL and the bit lines BL are connected to a row decoder 106 and a column decoder 107 respectively, as described later.

The gate electrodes of a prescribed number of selection transistors 102 are connected to each word line WL at prescribed intervals. Each selection transistor 102 is constituted of a pair of n-channel transistors 102a and 102b. The pair of n-channel transistors 102a and 102b constituting each selection transistor 102 have a common source region. The source region of each selection transistor 102 (n-channel transistors 102a and 102b) is grounded through a corresponding source line S101. In the selection transistors 102 connected to the same word line WL, each pair of a first selection transistor 102 (n-channel transistor 102a) and a second selection transistor 102 (n-channel transistor 102b) adjacent to each other have a common drain region.

A plurality of memory cells 104 each including a diode 103 are provided in the memory cell array 101. The plurality of memory cells 104 are arranged in the form of a matrix along the plurality of word lines WL and the plurality of bit lines BL respectively, while a prescribed number of such memory cells 104 are connected to each word line WL through the corresponding selection transistor 102. More specifically, the cathodes of the prescribed number of diodes 103 are connected to the drain regions of the n-channel transistors 102a and 102b constituting the corresponding selection transistor 102. The anodes of the diodes 103 of prescribed memory cells 104 included in the plurality of memory cells 104 are connected to the corresponding bit lines BL respectively, while the anodes of the diodes 103 of the remaining memory cells 104 are not connected to the corresponding bit lines BL. In the conventional diode ROM, data held in each memory cell 104 is determined as "0" or "1" depending on whether or not the anode of the diode 103 of this memory cell 104 is connected to the corresponding bit line BL.

An address input circuit 105, a row decoder 106, a column decoder 107, a sense amplifier 108 serving as a data determination portion and an output circuit 109 are provided outside the memory cell array 101.

A data read operation of the conventional crosspoint diode ROM is now described. In the following description of the data read operation, it is assumed that a memory cell 104 (hereinafter referred to as a selected memory cell 104) enclosed with a broken line in FIG. 11 is selected.

In the data read operation of the conventional crosspoint diode ROM, the row decoder 106 changes the potentials of the plurality of word lines WL on the basis of address data received from the address input circuit 105. More specifically, the row decoder 106 converts the potential of the word line WL (hereinafter referred to as a selected word line WL) connected to the selected memory cell 104 and the potentials of the remaining word lines WL (hereinafter referred to as nonselected word lines WL) to high and low levels respectively. Thus, the selection transistors 102 connected to the selected word line WL enter ON-states, while the selection transistors 102 connected to the nonselected word lines WL enter OFF-states. In the memory cells 104 connected to the selected word line WL, therefore, the potentials of the cathodes of the diodes 103 lower to the GND level (low level) through the source lines S101 due to the ON-state of the corresponding selection transistors 102. In the memory cells 104 connected to the nonselected word lines WL, on the other hand, the cathodes of the diodes 103 enter floating states due to the OFF-states of the corresponding selection transistors 102.

The bit line BL (hereinafter referred to as a selected bit line BL) corresponding to the selected memory cell 104 is connected to the sense amplifier 108 through the column decoder 107 on the basis of the address data received from the address input circuit 105, while the remaining bit lines BL (hereinafter referred to as nonselected bit lines BL) enter floating states. The anode of the diode 103 included in the selected memory cell 104 is not connected to the selected bit line BL, whereby no low-level potential is transmitted to the sense amplifier 108. In this case, a load circuit (not shown) provided in the sense amplifier 108 holds the potential of the selected bit line BL at a high level. Thus, the sense amplifier 108 determines and amplifies the potential of the selected bit line BL, and thereafter outputs a low-level signal of reversed polarity with respect to the high-level potential of the selected bit line BL. Consequently, the output circuit 109 outputs the low-level signal received from the sense amplifier 108.

In the conventional crosspoint diode ROM disclosed in the aforementioned Japanese Patent Laying-Open No. 2005-268370, however, the nonselected bit lines BL enter floating states in the data read operation, whereby the potentials of the anodes of the nonselected memory cells 104 (diodes 103) connected to the nonselected bit lines BL tend to fluctuate. If the potential of the anode of any nonselected memory cell 104 (diode 103) lowers from a high level, for example, the potentials of the cathodes of the remaining nonselected memory cells 104 connected to the nonselected bit line BL connected with this nonselected memory cell 104 also disadvantageously lower from high levels. If the anode of the diode 103 of any nonselected memory cell 104 is connected to the selected bit line BL in the data read operation in this case, the potential of the selected bit line BL disadvantageously temporarily lowers through the low potential of the cathode of this nonselected memory cell 104 (diode 103). Consequently, the selected bit line BL requires a standby time for returning the potential to the high level. Thus, it is disadvantageously difficult to operate the diode ROM at a high speed.

SUMMARY OF THE INVENTION

The present invention has been proposed in order to solve the aforementioned problems, and an object of the present invention is to provide a memory operable at a high speed.

In order to attain the aforementioned object, a memory according to an aspect of the present invention comprises a plurality of word lines, first transistors each connected to each of the plurality of word lines for entering an ON-state through selection of the corresponding word line, a plurality of memory cells including diodes having cathodes connected to the source or drain regions of the first transistors respectively and a data determination portion connected to the drain or source regions of the first transistors for determining data read from a selected memory cell.

As hereinabove described, the cathodes of the diodes included in the memory cells are connected to the source or drain regions of the first transistors each connected to each of the plurality of word lines to enter an ON-state through selection of the corresponding word line and the data determination portion is connected to the drain or source regions of the first transistors for determining the data tread from the selected memory cell, whereby the memory according to the aspect of the present invention can determine data on the basis of the potentials of the drain or source regions of the first transistors without connecting the bit lines to the data determination portion in data reading. Thus, the bit lines may not be brought into floating states in data reading dissimilarly to a case of connecting the data determination portion to the bit lines, whereby the memory can fix a selected bit line to a first potential (high level, for example) while fixing a nonselected bit line to a second potential (low level, for example). Thus, the memory, capable of fixing the potential of the nonselected bit line in data reading, can prevent the nonselected bit line from potential fluctuation. Therefore, the memory can prevent the diode included in a nonselected memory cell from potential fluctuation resulting from potential fluctuation of the nonselected bit line. In data reading, therefore, the memory can inhibit the selected bit line from potential fluctuation resulting from potential fluctuation of the cathode of the diode included in the nonselected memory cell. Consequently, the memory, requiring no standby time for returning the potential of the selected bit line to the original level, can operate at a high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a crosspoint diode ROM according to a first embodiment of the present invention is described with reference to FIGS. 1 to 3.

Figure 1:
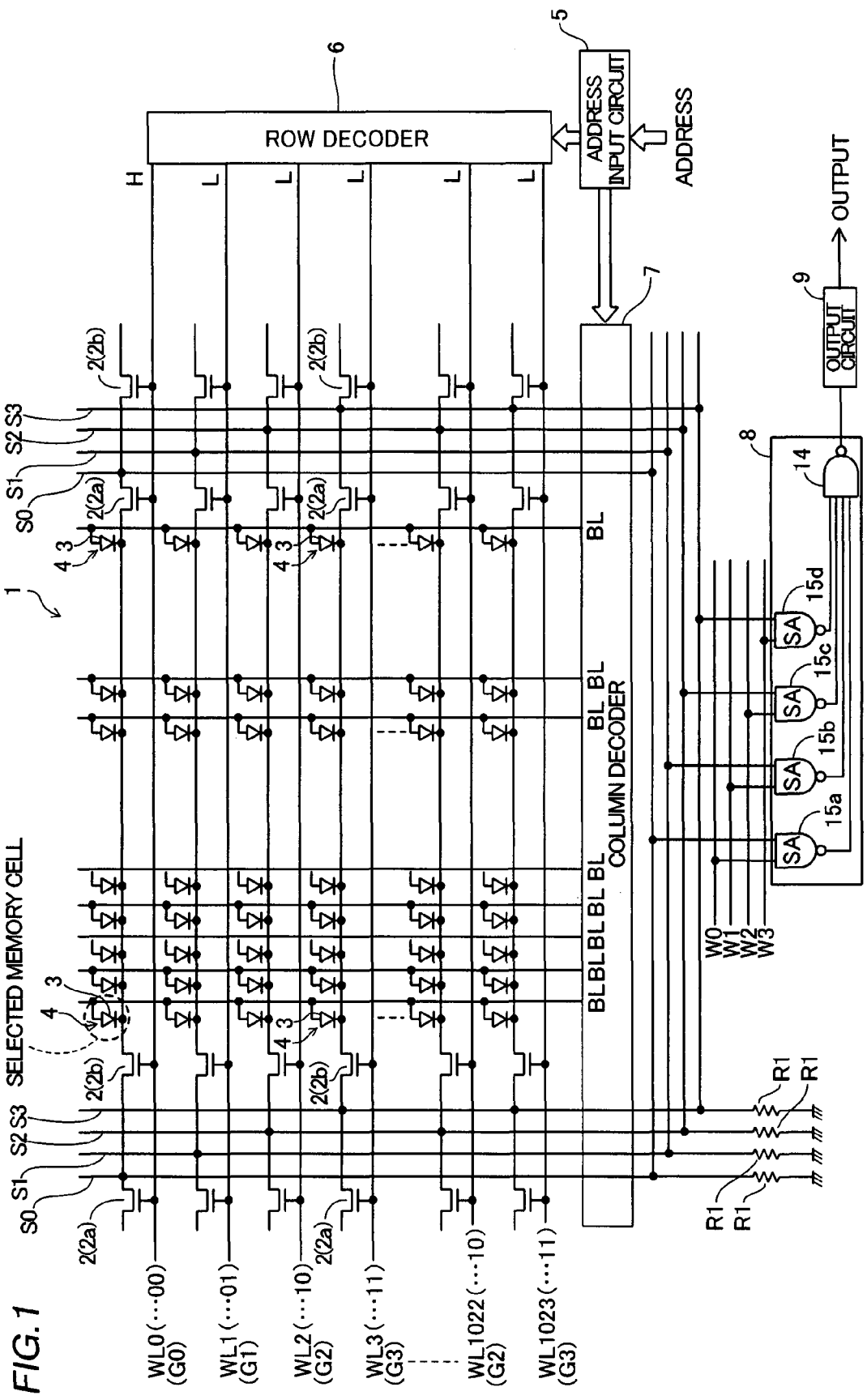
FIG. 1 is a circuit diagram showing the structure of a crosspoint diode ROM according to a first embodiment of the present invention.

In the crosspoint diode ROM according to the first embodiment, a plurality of word lines WL and a plurality of bit lines BL are arranged in a memory cell array 1 to intersect with each other, as shown in FIG. 1. The word lines WL and the bit lines BL are connected to a row decoder 6 and a column decoder 7 respectively, as described later. According to the first embodiment, 1024 word lines WL are arranged in the memory cell array 1, and an address having a plurality of digits consisting of bits including "0" and "1" is allocated to each of the 1024 word lines WL. While serial numbers 0 to 1023 are sequentially assigned to the 1024 word lines WL, FIG. 1 illustrates only the word lines WL having the serial numbers 0 to 3, 1022 and 1023.

According to the first embodiment, the 1024 word lines WL are classified into four word line groups G0 to G3 each including 256 word lines WL. More specifically, the first word line group G0 includes word lines WL having addresses with lower digits (bits) (0,0) while the second word line group G1 includes word lines WL having addresses with lower digits (bits) (0,1). The third word group G2 includes word lines WL having addresses with lower digits (bits) (1,0) while the fourth word group G3 includes word lines WL having addresses with lower digits (bits) (1,1).

The gate electrodes of a prescribed number of selection transistors 2 are connected to each word line WL at prescribed intervals. The selection transistors 2 are examples of the "first transistors" in the present invention. Each selection transistor 2 is constituted of a pair of n-channel transistors 2a and 2b. The pair of n-channel transistors 2a and 2b constituting each selection transistor 2 have a common source region. In the selection transistors 2 connected to the same word line WL, each pair of a first selection transistor 2 (n-channel transistor 2a) and a second selection transistor 2 (n-channel transistor 2b) adjacent to each other have a common drain region.

A plurality of memory cells 4 each including a diode 3 are provided in the memory cell array 1. The plurality of memory cells 4 are arranged in the form of a matrix along the plurality of word lines WL and the plurality of bit lines BL respectively, while a prescribed number of such memory cells 4 are connected to each word line WL through the corresponding selection transistor 2. More specifically, the cathodes of the prescribed number of diodes 3 are connected to the drain regions of the n-channel transistors 2a and 2b constituting the corresponding selection transistor 2. The anodes of the diodes 3 of prescribed memory cells 4 (holding data "1") included in the plurality of memory cells 4 are connected to the corresponding bit lines BL, while the anodes of the diodes 3 of the remaining memory cells 4 (holding data "0") are not connected to the corresponding bit lines BL. In the crosspoint diode ROM according to the first embodiment, the data held in each memory cell 4 is determined as "0" or "1" depending on whether or not the anode of the diode 3 of this memory cell 4 is connected to the corresponding bit line BL.

An address input circuit 5, a row decoder 6, a column decoder 7, a data determination circuit 8 and an output circuit 9 are provided outside the memory cell array 1. The data determination circuit 8 is an example of the "data determination portion" in the present invention. The address input circuit 5 has a function of supplying address data to the row decoder 6 and the column decoder 7 in response to a prescribed address externally received therein. In other words, a signal generation circuit 10 (see FIG. 2) for generating signals corresponding to the externally received address is provided in the address input circuit 5.

Figure 2:
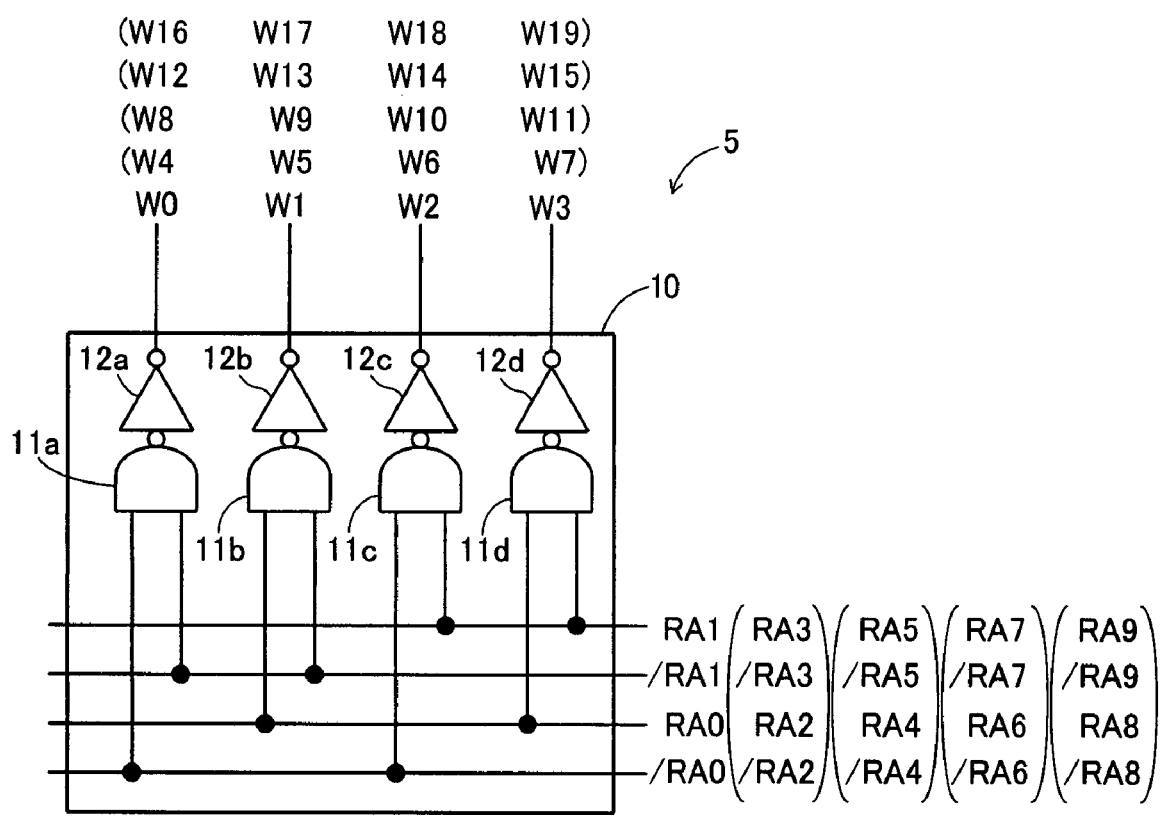
FIG. 2 is a circuit diagram showing the internal structure of an address input circuit of the diode ROM according to the first embodiment shown in FIG. 1.

The signal generation circuit 10 provided in the address input circuit 5 has a function of generating signals W0 to W3 corresponding to the address (bits of a plurality of digits) corresponding to a selected word line WL, as shown in FIG. 2.

Referring to FIG. 2, symbols RA0 and RA1 denote signals based on the first and second digits (bits) of the address corresponding to the selected word line WL respectively. Symbols /RA0 and /RA1 denote inverted signals obtained by inverting the potentials of the signals RA0 and RA1 respectively. When the lower digits (bits) of the address corresponding to the selected word line WL are (0,0), both of the signals RA0 and RA1 have low-level potentials, while both of the signals /RA0 and /RA1 have high-level potentials. When the lower digits (bits) of the address corresponding to the selected word line WL are (0,1), the signals RA0 and RA1 have high- and low-level potentials respectively, while the signals /RA0 and /RA1 have low- and high-level potentials respectively. When the lower digits (bits) of the address corresponding to the selected word line WL are (1,0), the signals RA0 and RA1 have low- and high-level potentials respectively, while the signals /RA0 and /RA1 have high- and low-level potentials respectively. When the lower digits (bits) of the address corresponding to the selected word line WL are (1,1), both of the signals RA0 and RA1 have high-level potentials, while both of the signals /RA0 and /RA1 have low-level potentials.

The signal generation circuit 10 includes four two-input NAND circuits 11a to 11d and four inverter circuits 12a to 12d. The two-input NAND circuit 11a receives the signals /RA0 and /RA1 in first and second input terminals thereof respectively. The two-input NAND circuit 11b receives the signals RA0 and /RA1 in first and second input terminals thereof respectively. The two-input NAND circuit 11c receives the signals /RA0 and RA1 in first and second input terminals thereof respectively. The two-input NAND circuit 11d receives the signals RA0 and RA1 in first and second input terminals thereof respectively.

Input terminals of the inverter circuits 12a to 12d are connected to output terminals of the two-input NAND circuits 11a to 11d respectively. The output terminals of the inverter circuits 12a and 12b output the signals W0 and W1 respectively. The output terminals of the inverter circuits 12c and 12d output the signals W2 and W3 respectively.

Signal generation circuits (not shown) for generating signals W4 to W7, W8 to W11, W12 to W15 and W16 to W19 respectively are similar in structure to the signal generation circuit 10. However, the signals W4 to W7 are generated through signals (RA2, /RA2 RA3 and /RA3) based on the third and fourth digits (bits) of the address corresponding to the selected word line WL respectively. The signals W8 to W11 are generated through signals (RA4, /RA4, RA5 and /RA5) based on the fifth and sixth digits (bits) of the address corresponding to the selected word line WL respectively. The signals W12 to W15 are generated through signals (RA6, /RA6, RA7 and /RA7) based on the seventh and eighth digits (bits) of the address corresponding to the selected word line WL respectively. The signals W16 to W19 are generated through signals (RA8, /RA8, RA9 and /RA9) based on the ninth and tenth digits (bits) of the address corresponding to the selected word line WL respectively.

When the address input circuit 5 having the aforementioned structure receives the prescribed address, the signal generation circuit 10 generates the signals W0 to W3 so that only one of these signals W0 to W3 goes high and the remaining ones go low. The remaining signal generation circuits (not shown) also generate the signals W4 to W7 W8 to W11, W12 to W15 and W16 to W19 similarly to the signal generation circuit 10.

As shown in FIG. 1, the row decoder 6 has a function of selecting a prescribed word line WL on the basis of the address data supplied from the address input circuit 5 for supplying a high-level signal to the selected word line WL while supplying low-level signals to the nonselected word lines WL. This row decoder 6 includes 1024 five-input AND circuits 13 having output terminals connected to the word lines WL respectively, as shown in FIG. 3.

According to the first embodiment, the signal W0 generated in the address input circuit 5 (see FIG. 2) is supplied to first input terminals of the five-input AND circuits 13 connected to the word lines WL included in the word line group G0. The signal W1 generated in the address input circuit 5 is supplied to first input terminals of the five-input AND circuits 13 connected to the word lines WL included in the word line group G1. The signal W2 generated in the address input circuit 5 is supplied to first input terminals of the five-input AND circuits 13 connected to the word lines WL included in the word line group G2. The signal W3 generated in the address input circuit 5 is supplied to first input terminals of the five-input AND circuits 13 connected to the word lines WL included in the word line group G3. Thus, the signals W0 to W3 generated in the address input circuit 5 are supplied to the different word line groups G0 to G3 respectively according to the first embodiment. In other words, the four word line groups G0 to G3 are classified through the signals W0 to W3 supplied to the first input terminals of the five-input AND circuits 13 respectively.

Any ones of the signals W4 to W7 generated in the address input circuit 5 (see FIG. 2) are supplied to second input terminals of the five-input AND circuits 13 respectively. Any ones of the signals W8 to W11 generated in the address input circuit 5 are supplied to third input terminals of the five-input AND circuits 13 respectively. Any ones of the signals W12 to W15 generated in the address input circuit 5 are supplied to fourth input terminals of the five-input AND circuits 13 respectively. Any ones of the signals W16 to W19 generated in the address input circuit 5 are supplied to fifth input terminals of the five-input AND circuits 13 respectively. According to the first embodiment, the signals W0 to W19 are so supplied that only the five-input AND circuit 13 connected to the selected word line WL outputs a high-level signal.

According to the first embodiment, the column decoder 7 has a function of supplying signals having prescribed potentials to the bit lines BL connected thereto, as shown in FIG. 1. More specifically, the column decoder 7 is so formed as to select a prescribed bit line BL on the basis of the address data supplied from the address input circuit 5, for supplying a high-level signal to the selected bit line BL while supplying low-level signals to the nonselected bit lines BL. The high-level signal supplied to the selected bit line BL is an example of the "signal of a first potential", and the low-level signals supplied to the nonselected bit lines BL are examples of the "signal of a second potential" in the present invention.

The data determination circuit 8 has a function of determining the potential of data (signal) read from a selected memory cell 4 and supplying a signal responsive to the result of this determination to the output circuit 9. More specifically, the data determination circuit 8 supplies a high-level signal to the output circuit 9 when the data held in the selected memory cell 4 is at a high level, while supplying a low-level signal to the output circuit 9 when the data held in the selected memory cell 4 is at a low level.

The data determination circuit 8 includes a four-input NAND circuit 14 and two-input NAND circuits 15a to 15d. The four-input NAND circuit 14 has input terminals connected to output terminals of the two-input NAND circuits 15a to 15d respectively and an output terminal connected to the output circuit 9. The signals W0 to W3 generated in the address input circuit 5 are supplied to first input terminals of the two-input NAND circuits 15a to 15d respectively. In other words, the two-input NAND circuits 15a and 15b are supplied with the signals W0 and W1 corresponding to the word lines groups G0 and G1 respectively. Further, the two-input NAND circuits 15c and 15d are supplied with the signals W2 and W3 corresponding to the word line groups G2 and G3 respectively. According to the first embodiment, therefore, only one of the signals W0 to W3 goes high when the prescribed word line WL is selected, whereby a high-level signal is supplied to only the first input terminal of any of the two-input NAND circuits 15a to 15d.

According to the first embodiment, second input terminals of the two-input NAND circuits 15a to 15d are connected to signal lines S0 to S3 respectively. The signal lines S0 to S3 are examples of the "first signal line" in the present invention. Prescribed numbers of such signal lines S0 to S3 are provided for the word line groups G0 to G3 respectively. More specifically, the signal line S0 is connected to the source regions of the selection transistors 2 corresponding to the word lines WL included in the word line group G0 respectively. The signal line S1 is connected to the source regions of the selection transistors 2 corresponding to the word lines WL included in the word line group G1 respectively. The signal line S2 is connected to the source regions of the selection transistors 2 corresponding to the word lines WL included in the word line group G2 respectively. The signal line S3 is connected to the source regions of the selection transistors 2 corresponding to the word lines WL included in the word line group G3 respectively. The signal lines S0 to S3 are grounded through resistances R1.

A data read operation of the crosspoint diode ROM according to the first embodiment is now described with reference to FIGS. 1 to 3. In the following description of the read operation, it is assumed that a memory cell 4 (hereinafter referred to as a selected memory cell 4) enclosed with a broken line in FIG. 1 is selected. In the following description of the read operation, it is also assumed that the address of the selected word line WL (WL0 in FIG. 1) has 10 digits (bits) (0,0,0,0, 0,0,0,0,0,0). In the following description of the read operation, further, the memory cells 4 other than the selected memory cell 4 are referred to as nonselected memory cells 4. In the following description of the read operation, further, the selected word line WL is referred to as the selected word line WL0, and the remaining word lines WL are referred to as nonselected word lines WL. In the following description of the read operation, further, the bit lines BL other than the selected bit line BL are referred to as nonselected bit lines BL.

As shown in FIG. 1, the address corresponding to the selected memory cell 4 is externally input in the address input circuit 5. Thus, the address input circuit 5 outputs address data, which in turn is supplied to the row decoder 6 and the column decoder 7.

At this time, the signal generation circuit 10 shown in FIG. 2 operates as follows: The lower digits (bits) of the address corresponding to the selected word line WL0 are (0,0), whereby both of the potentials of the signals RA0 and RA1 go low while both of the potentials of the signals /RA0 and /RA1 go high. Thus, the two-input NAND circuit 11a receives the high-level signals /RA0 and RA1 in the first and second input terminals respectively, thereby outputting a low-level signal from the output terminal thereof. The two-input NAND circuit 11b receives the low- and high-level signals RA0 and /RA1 in the first and second input terminals respectively, thereby outputting a high-level signal from the output terminal thereof. The two-input NAND circuit 11c receives the high- and low-level signals /RA0 and RA1 in the first and second input terminals respectively, thereby outputting a high-level signal from the output terminal thereof. The two-input NAND circuit 11d receives the low-level signals RA0 and RA1 in the first and second input terminals respectively, thereby outputting a high-level signal from the output terminal thereof.

The signals output from the output terminals of the two-input NAND circuits 11a to 11d are input in the input terminals of the inverter circuits 12a to 12d respectively. Thus, the inverter circuit 12a inverts the low-level signal and outputs a high-level signal W0 from the output terminal thereof. The inverter circuits 12b to 12d invert the high-level signals and output low-level signals W1 to W3 from the output terminals thereof respectively. In other words, the signal W0 corresponding to the word line group G0 including the selected word line WL0 goes high, while the signals W1 to W3 corresponding to the word line groups G1 to G3 not including the selected word line WL0 go low. The signal generation circuits (not shown) for generating the signals W4 to W7, W8 to W11, W12 to W15 and W16 to W19 respectively also operate similarly to the signal generation circuit 10.

Figure 3:
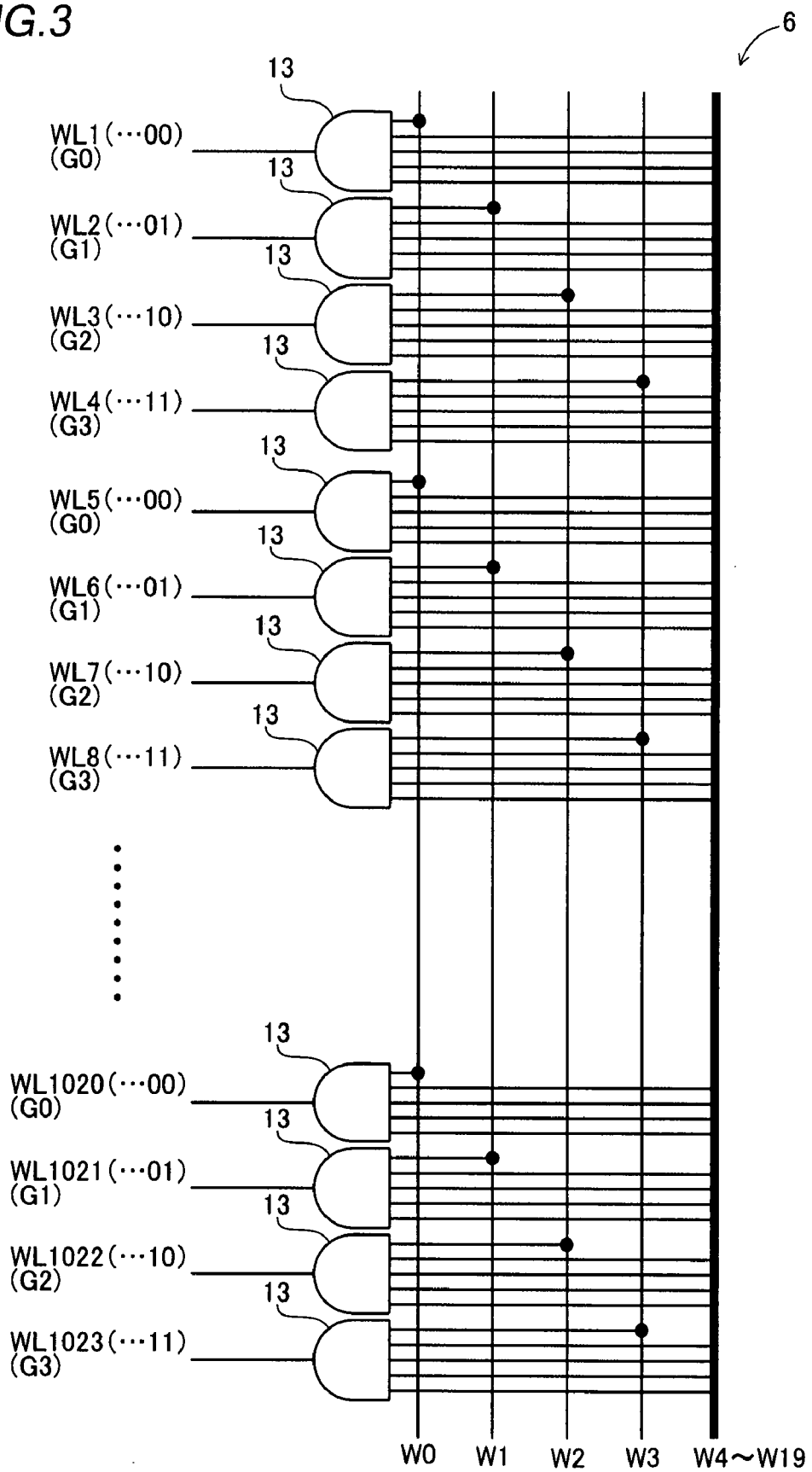
FIG. 3 is a circuit diagram showing the internal structure of a row decoder of the diode ROM according to the first embodiment shown in FIG. 1.

In the row decoder 6 supplied with the signals W0 to W19 generated in the address input circuit 5 (see FIG. 2) as shown in FIG. 3, the five-input NAND circuit 13 connected to the selected word line WL0 outputs a high-level signal while the five-input NAND circuits 13 connected to the nonselected word lines WL output low-level signals on the basis of the potentials of the signals W0 to W19. Thus, only the selected word line WL0 is supplied with the high-level signal, while the nonselected word lines WL are supplied with the low-level signals. Consequently, the potentials of the gate electrodes of the selection transistors 2 corresponding to the selected word line WL0 go high so that these selection transistors 2 enter ON-states, as shown in FIG. 1. On the other hand, the potentials of the gate electrodes of the selection transistors 2 corresponding to the nonselected word lines WL go low, so that these selection transistors 2 enter OFF-states.

The column decoder 7 supplies signals having prescribed potentials to the bit lines BL connected thereto on the basis of the address data. More specifically, the column decoder 7 supplies a high-level signal only to the selected bit line BL, while supplying low-level signals to the nonselected bit lines BL.

The row decoder 6 and the column decoder 7 operate in the aforementioned manner, thereby supplying the data (signal) held in the selected memory cell 4 to the signal line S0 through the corresponding ON-state selection transistor 2. More specifically, the anode of the diode 3 included in the selected memory cell 4 is connected to the selected bit line BL according to the first embodiment, whereby the high-level signal supplied to the selected bit line BL is transmitted to the signal line S0. If the anode of the diode 3 included in the selected memory cell 4 is not connected to the selected bit line BL, however, the high-level signal supplied to the selected bit line BL is not transmitted to the signal line S0. Data held in the nonselected memory cells 4 connected to the nonselected word lines WL are not transmitted to the signal lines S0 to S3 due to the OFF-states of the corresponding selection transistors 2.

In the data termination circuit 8, the first input terminal of the two-input NAND circuit 15a corresponding to the word line group G0 is supplied with the high-level signal W0 corresponding to the word line group G0, while the first input terminals of the two-input NAND circuits 15b to 15d corresponding to the word line groups G1 to G3 are supplied with the low-level signals W1 to W3 corresponding to the word line groups G1 to G3 respectively. The second input terminal of the two-input NAND circuit 15a is supplied with the high-level signal through the signal line S0 in this state, whereby the two-input NAND circuit 15a outputs a low-level signal. On the other hand, the first input terminals of the two-input NAND circuits 15b to 15d are supplied with the low-level signals W1 to W3 respectively, whereby the two-input NAND circuits 15b to 15d output high-level signals regardless of signals supplied to the second input terminals thereof through the signal lines S1 to S3 respectively.

The low-level signal output from the two-input NAND circuit 15a and the high-level signals output from the two-input NAND circuits 15b to 15d are supplied to the four-input NAND circuit 14. Thus, the four-input NAND circuit 14 outputs a high-level signal, which in turn is supplied to the output circuit 9. Consequently, the output circuit 9 outputs the high-level signal.

If the anode of the diode 3 included in the selected memory cell 4 is not connected to the selected bit line BL, a low-level signal is supplied to the second input terminal of the two-input NAND circuit 15a through the signal line S0. Therefore, all of the two-input NAND circuits 15a to 15d output high-level signals, which in turn are supplied to the four-input NAND circuit 14 so that the four-input NAND circuit 14 outputs a low-level signal. Consequently, the output circuit 9 supplied with the low-level signal outputs this low-level signal. Even if the anodes of the diodes 3 are connected to the nonselected bit lines BL in the nonselected memory cells 4 corresponding to the selected word line WL0 in this case, the potentials of the cathodes of the diodes 3 included in the nonselected memory cells 4 do not go high since the nonselected bit lines BL are supplied with low-level signals. When the anode of the diode 3 included in the selected memory cell 4 is not connected to the selected bit line BL, therefore, no high-level signal is transmitted to the signal line S0.

According to the first embodiment, as hereinabove described, the cathodes of the diodes 3 included in the memory cells 4 are connected to the drain regions of the selection transistors 2 while the data determination circuit 8 is connected to the source regions through the signal lines S0 to S3, whereby the crosspoint diode ROM can determine data on the basis of the potentials of the source regions of the selection transistors 2 without connecting the bit lines BL to the data determination circuit 8 in data reading. Therefore, the bit lines BL may not be brought into floating states in data reading dissimilarly to a case of connecting the data determination circuit 8 to the bit lines BL, whereby the potential of the selected bit line BL can be fixed to a high level and those of the nonselected bit lines BL can be fixed to low levels. The crosspoint diode ROM can fix the potentials of the nonselected bit lines BL in data reading in this manner, thereby preventing the nonselected bit lines BL from potential fluctuation. Thus, the crosspoint diode ROM can prevent the cathodes of the diodes 3 included in the nonselected memory cells 4 from potential fluctuation resulting from potential fluctuation of the nonselected bit lines BL. In data reading, therefore, the crosspoint diode ROM can inhibit the selected bit line BL from potential fluctuation resulting from potential fluctuation of the cathodes of the diodes 3 included in the nonselected memory cells 4. Consequently, the crosspoint diode ROM, requiring no standby time for returning the potential of the selected bit line BL to the original level, can operate at a high speed.

According to the first embodiment, as hereinabove described, the source regions of the selection transistors 2 corresponding to the word line groups G0 to G3 are connected to the data determination circuit 8 through the signal lines S0 to S3 provided for the word line groups G0 to G3 respectively, whereby the crosspoint diode ROM can easily determine data on the basis of the potentials of the source regions of the selection transistors 2 corresponding to the word line groups G0 to G3 respectively. Further, the signal lines S0 to S3 provided for the word line groups G0 to G3 respectively connect the source regions of the selection transistors 2 and the data determination circuit 8 with each other, whereby the number of the signal lines S0 to S3 can be reduced as compared with a case of linking the source regions of the selection transistors 2 and the data determination circuit 8 with each other through 1024 signal lines provided for the 1024 word lines WL respectively. Thus, the capacity of the signal lines S0 to s3 connected to the data determination circuit 8 can be so reduced that the crosspoint diode ROM can operate at a higher speed.

Second Embodiment

Referring to FIGS. 4 to 6, 1024 word lines WL are classified into 16 word line groups G0 to G15 in a crosspoint diode ROM according to a second embodiment of the present invention, dissimilarly to the aforementioned first embodiment.

Figure 4:
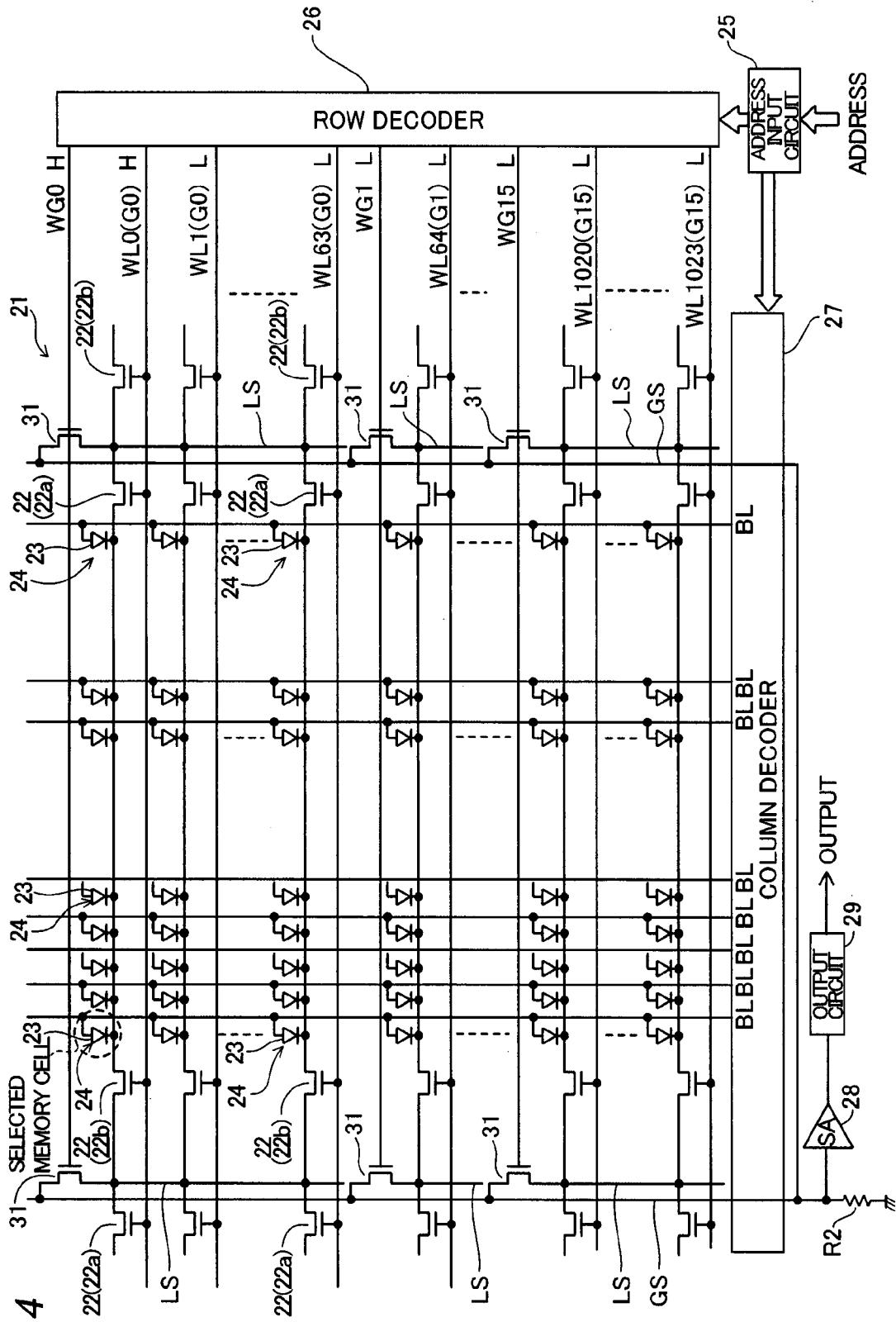
FIG. 4 is a circuit diagram showing the structure of a crosspoint diode ROM according to a second embodiment of the present invention.

In the crosspoint diode ROM according to the second embodiment, a plurality of (1024) word lines WL and a plurality of bit lines BL are arranged in a memory cell array 21 to intersect with each other similarly to the aforementioned first embodiment, as shown in FIG. 4. FIG. 4 illustrates only word lines WL having serial numbers 0, 1, 63, 64, 1020 and 1023 included in the 1024 word lines WL.

According to the second embodiment, the 1024 word lines WL are classified into the 16 word lie groups G0 to G15 each including 64 word lines WL. More specifically, the first word line group G0 includes the first to $64^{th}$ word lines WL0 to WL63, and the second word line group G1 includes the $65^{th}$ to $128^{th}$ word lines WL64 to WL127. The word line groups G2 to G15 also sequentially include the $129^{th}$ to $1023^{rd}$ word lines WL129 to WL1024. In other words, the $16^{th}$ word line group G15 includes the $959^{th}$ to $1023^{rd}$ word lines WL960 to WL1024.

The gate electrodes of a prescribed number of selection transistors 22 are connected to each word line WL at prescribed intervals. The selection transistors 22 are similar in structure to the selection transistors 2 according to the aforementioned first embodiment.

A plurality of memory cells 24 each including a diode 23 are provided in the memory cell array 21. The diodes 23 and the memory cells 24 are similar in structure to the diodes 3 and the memory cells 4 according to the aforementioned first embodiment respectively.

According to the second embodiment, selection transistors 31 formed by n-channel transistors are arranged for the 16 word line groups G0 to G15 respectively. The gate electrodes of the selection transistors 31 are connected to a row decoder 26 described later. The source or drain regions of the selection transistors 31 are connected to the source regions of the selection transistors 22 included in the corresponding word line groups G0 to G15 through local signal lines LS provided for the word line groups G0 to G15 respectively. The drain or source regions of the selection transistors 31 are connected to a sense amplifier 28 described later through a global signal line GS common to the 16 word line groups G0 to G15. The global signal line GS connected to the sense amplifier 28 is grounded through a resistance R2. The selection transistors 31 are examples of the "second transistors" in the present invention. The local signal lines LS and the global signal line GL are examples of the "sub signal lines" and the "main signal line" in the present invention respectively.

The row decoder 26 controls the selection transistor 31 corresponding to the word line group including a selected word line WL to enter an ON-state. On the other hand, the row decoder 26 controls the selection transistors 31 corresponding to the word line groups not including the selected word line WL to enter OFF-states.

Figure 5:
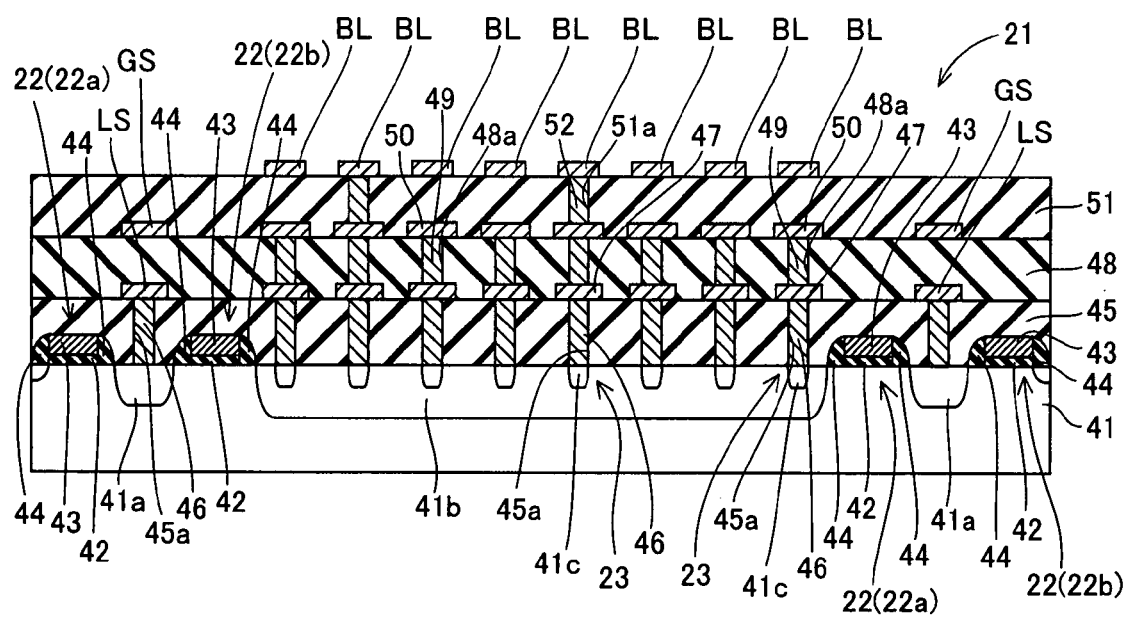
FIG. 5 is a sectional view partially showing a memory cell array of the diode ROM according to the second embodiment shown in FIG. 4.

FIG. 5 shows the sectional structure of the aforementioned memory cell array 21. More specifically, n-type impurity regions 41a and 41b serving as the source and drain regions of the selection transistors 22 are formed on the upper surface of a p-type silicon substrate 41 in the sectional structure of the memory cell array 21. The n-type impurity regions 41b also serve as the cathodes of the diodes 23. A plurality of p-type impurity regions 41c serving as the anodes of the diodes 23 are formed in each n-type impurity region 41b of the p-type silicon substrate 41 at prescribed intervals. The aforementioned diodes 23 are constituted of the n-type impurity regions (cathodes) 41b and the p-type impurity regions (anodes) 41c.

Gate electrodes 43 are formed on regions of the p-type silicon substrate 41 located between the n-type impurity regions 41a and 41b through gate insulating films 42. Side wall films 44 are formed on the side surfaces of the gate insulating films 42 and the gate electrodes 43. The aforementioned selection transistors 22 (n-channel transistors 22a and 22b) are constituted of the n-type impurity regions (source and drain regions) 41a and 41b, the gate insulating films 42 and the gate electrodes 43.

A first interlayer dielectric film 45 is formed on the p-type silicon substrate 41 to cover the selection transistors 22. Contact holes 45a are formed in regions of the first interlayer dielectric film 45 corresponding to the n-type impurity regions 41a (source regions of the selection transistors 22) and the p-type impurity regions 41c (anodes of the diodes 23). Plugs 46 are embedded in the contact holes 45a of the first interlayer dielectric film 45. The aforementioned local signal lines LS are formed on regions of the first interlayer dielectric film 45 corresponding to the n-type impurity regions 41a (source regions of the selection transistors 22) and connected to the n-type impurity regions 41a through the plugs 46. First connecting layers 47 are formed on regions of the first interlayer dielectric film 45 corresponding to the p-type impurity regions 41c (anodes of the diodes 23).

A second interlayer dielectric film 48 is formed on the first interlayer dielectric film 45 to cover the local signal lines SL and the connecting layers 47. The aforementioned global signal line GL is formed on regions of the second interlayer dielectric film 48 corresponding to the local signal lines LS. In other words, the second interlayer dielectric film 48 isolates the global signal line GL and the local signal lines LS from each other. Contact holes 48a are formed in regions of the second interlayer dielectric film 48 corresponding to the connecting layers 47, and plugs 49 are embedded in these contact holes 48a. Second connecting layers 50 are formed on regions of the second interlayer dielectric film 48 corresponding to the plugs 49.

A third interlayer dielectric film 51 is formed on the second interlayer dielectric film 48 to cover the global signal line GS and the connecting layers 50. Contact holes 51a are formed in prescribed regions of the third interlayer dielectric film 51, and plugs 52 are embedded in these contact holes 51a. The aforementioned plurality of bit lines BL are arranged on the third interlayer dielectric film 51 at prescribed intervals. The plurality of bit lines BL include those connected to the second connecting layers 50 (anodes of the diodes 23) through the plugs 52 and those not connected to the second connecting layers 50 (anodes of the diodes 23).

As shown in FIG. 4, an address input circuit 25, the row decoder 26, a column decoder 27, the sense amplifier 28 and an output circuit 29 are provided outside the memory cell array 21. The sense amplifier 28 is an example of the "data determination portion" in the present invention. The address input circuit 25 has a function of supplying address data to the row decoder 26 and the column decoder 27 in response to a prescribed address externally received therein, similarly to the address input circuit 5 according to the aforementioned first embodiment. In other words, signal generation circuits (not shown) for generating signals W0 to W19 corresponding to the received address are provided in the address input circuit 25, similarly to the signal generation circuit 10 according to the aforementioned first embodiment.

Figure 6:
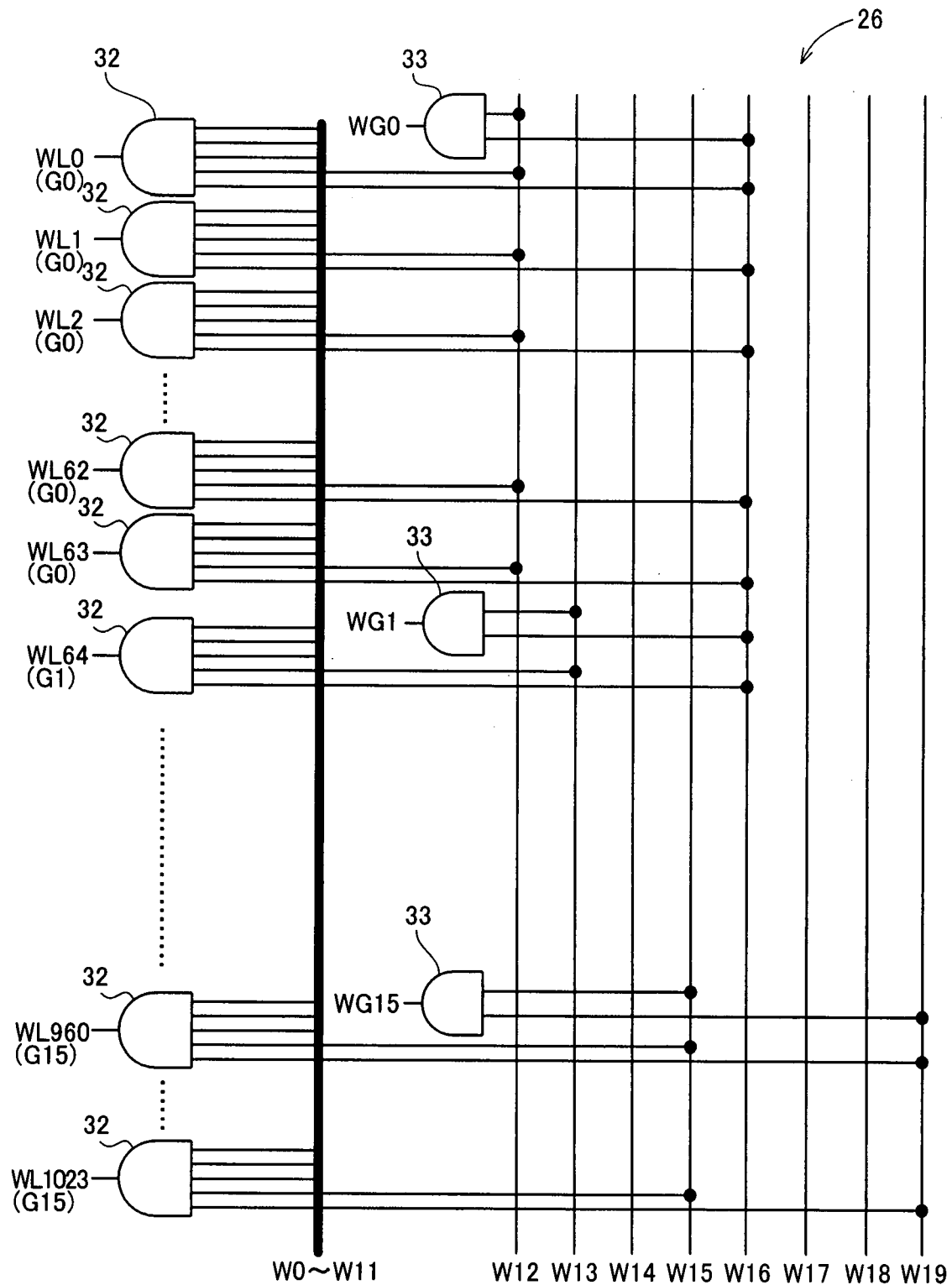
FIG. 6 is a circuit diagram showing the internal structure of a row decoder of the diode ROM according to the second embodiment shown in FIG. 4.

The row decoder 26 has a function of selecting a prescribed word line WL on the basis of the address data supplied from the address input circuit 25 for supplying a high-level signal to the selected word line WL while supplying low-level signals to the nonselected word lines WL. As shown in FIG. 6, the row decoder 26 includes 1024 five-input AND circuits 32 having output terminals connected to the word lines WL respectively.

According to the second embodiment, the signals W12 and W16 generated in the address input circuit 25 (see FIG. 4) are supplied to fourth and fifth input terminals of the five-input AND circuits 32 connected to the word lines WL included in the word line group G0 respectively. The signals W13 and W16 generated in the address input circuit 25 are supplied to fourth and fifth input terminals of the five-input AND circuits 32 connected to the word lines WL included in the word line group G1 respectively. The signals W15 and W19 generated in the address input circuit 25 are supplied to fourth and fifth input terminals of the five-input AND circuits 32 connected to the word lines WL included in the word line group G15 respectively. Thus, the signals W12 to W15 and W16 to W19 generated in the address input circuit 25 are supplied to the different word line groups G0 to G15 respectively according to the second embodiment. In other words, the 16 word line groups G0 to G15 are classified according to combinations of the signals W12 to W15 and W16 to W19 supplied to the fourth and fifth input terminals of the five-input AND circuits 32 corresponding thereto.

Any ones of the signals W0 to W3 generated in the address input circuit 25 (see FIG. 4) are supplied to first input terminals of the five-input AND circuits 32 respectively. Any ones of the signals W4 to W7 generated in the address input circuit 25 are supplied to second input terminals of the five-input AND circuits 32 respectively. Any ones of the signals W8 to W11 generated in the address input circuit 25 are supplied to third input terminals of the five-input AND circuits 32 respectively. According to the second embodiment, the signals W0 to W19 are so supplied that only the five-input AND circuit 32 connected to the selected word line WL outputs a high-level signal.

According to the second embodiment, the row decoder 26 further includes 16 two-input AND circuits 33 arranged for the word line groups G0 to G15 respectively. Output terminals of the two-input AND circuits 33 are connected to the gate electrodes of the selection transistors 31 included in the corresponding word line groups G0 to G15 through signal lines WG0 to WG15 respectively. First input terminals of the two-input AND circuits 33 are supplied with the same ones of the signals W12 to W15 generated in the address input circuit 25 (see FIG. 4) and supplied to the five-input AND circuits 32 of the corresponding word line groups G0 to G15 respectively. Second input terminals of the two-input AND circuits 33 are supplied with the same ones of the signals W16 to W19 generated in the address input circuit 25 and supplied to the five-input AND circuits 32 of the corresponding word line groups G0 to G15 respectively. Thus, the two-input AND circuits 33 corresponding to the word line group including the selected word line WL output high-level signals from the outer terminals thereof, while the two-input AND circuits 33 corresponding to the word line groups not including the selected word line WL output low-level signals from the outer terminals thereof.

According to the second embodiment, the column decoder 27 is so formed as to select a prescribed bit line BL on the basis of the address data supplied from the address input circuit 25 for supplying a high-level signal to the selected bit line BL while supplying low-level signals to nonselected bit lines BL as shown in FIG. 4, similarly to the column decoder 7 according to the aforementioned first embodiment.

The sense amplifier 28 has a function of determining the potential of a signal (data read from a selected memory cell 24) supplied through the global signal line GL and supplying a signal responsive to the result of this determination to the output circuit 29. More specifically, the sense amplifier 28 supplies a high-level signal to the Output circuit 29 when data held in the selected memory cell 24 is at a high level, while supplying a low-level signal to the output circuit 29 when the data held in the selected memory cell 24 is at a low level.

A data read operation of the crosspoint diode ROM according to the second embodiment is now described with reference to FIGS. 4 and 6. In the following description of the read operation, it is assumed that a memory cell 24 (hereinafter referred to as a selected memory cell 24) enclosed with a broken line in FIG. 4 is selected. In the following description of the read operation, the memory cells 24 other than the selected memory cell 24 are referred to as nonselected memory cells 24. In the following description of the read operation, further, the selected word line WL is referred to as the selected word line WL0, and the remaining word lines WL are referred to as nonselected word lines WL. In the following description of the read operation, further, the bit lines BL other than the selected bit line BL are referred to as nonselected bit lines BL.

As shown in FIG. 4, the address corresponding to the selected memory cell 24 is externally input in the address input circuit 25. Thus, the address input circuit 25 outputs address data, which in turn is supplied to the row decoder 26 and the column decoder 27.

At this time, the address input circuit 25 operates identically to the address input circuit 5 (signal generation circuit 10) according to the aforementioned first embodiment. Therefore, the five-input AND circuit 32 connected to the selected word line WL0 outputs a high-level signal while the five-input AND circuits 32 connected to the nonselected word lines WL output low-level signals, as shown in FIG. 6. Thus, only the selected word line WL0 is supplied with the high-level signal, while the nonselected word lines WL are supplied with the low-level signals. Consequently, the potentials of the gate electrodes of the selection transistors 22 corresponding to the selected word line WL0 go high, so that these selection transistors 22 enter ON-states as shown in FIG. 4. On the other hand, the potentials of the gate electrodes of the selection transistors 22 corresponding to the nonselected word lines WL go low, so that these selection transistors 22 enter OFF-states.

In the two-input AND circuit 33 corresponding to the word line group G0 including the selected word line WL0, high-level signals W12 and W16 generated in the address input circuit 25 (see FIG. 4) are supplied to the first and second input terminals respectively, as shown in FIG. 6. Thus, the two-input AND circuit 33 corresponding to the word line group G0 including the selected word line WL0 outputs a high-level signal. On the other hand, the two-input AND circuits 33 corresponding to the word line groups G1 to G15 not including the selected word line WL0 output low-level signals. Consequently, the high-level signal is supplied to the gate electrode of the selection transistor 31 corresponding to the word line group G0 including the selected word line WL0 so that the selection transistor 31 enters an ON-state, as shown in FIG. 4. On the other hand, the low-level signals are supplied to the gate electrodes of the selection transistors 31 corresponding to the word line groups G1 to G15 not including the selected word line WL0, so that the selection transistors 31 enter OFF-states.

The column decoder 27 supplies signals having prescribed potentials to the bit lines BL connected thereto on the basis of the address data. More specifically, the column decoder 27 supplies a high-level signal only to the selected bit line BL, while supplying low-level signals to the nonselected bit lines BL.

The row decoder 26 and the column decoder 27 operate in the aforementioned manner, thereby supplying the data (signal) held in the selected memory cell 24 to the local signal line LS corresponding to the word line group G0 including the selected word line WL0 through the corresponding ON-state selection transistor 22. More specifically, the anode of the diode 23 included in the selected memory cell 24 is connected to the selected bit line BL according to the second embodiment, whereby the high-level signal supplied to the selected bit line BL is transmitted to the corresponding local signal line LS. If the anode of the diode 23 included in the selected memory cell 24 is not connected to the selected bit line BL, however, the high-level signal supplied to the selected bit line BL is not transmitted to the corresponding local signal line LS. Data held in the nonselected memory cells 24 connected to the nonselected word lines WL are not transmitted to the local signal lines LS due to the OFF-states of the corresponding selection transistors 22.

The selection transistor 31 corresponding to the word line group G0 including the selected word line WL0 is in the ON-state and the selection transistors 31 corresponding to the word line groups G1 to G15 not including the selected word line WL0 are in the OFF-states, whereby the global signal line GS is supplied with the high-level signal from the local signal line LS corresponding to the word line group G0 including the selected word line WL0. Thus, the sense amplifier 28 is supplied with the high-level signal. Consequently, the sense amplifier 28 supplies the high-level signal to the output circuit 29, which in turn outputs the high-level signal.

If the anode of the diode 23 included in the selected memory cell 24 is not connected to the selected bit line BL, a low-level signal is supplied to the sense amplifier 28 through the global signal line GS. Consequently, the sense amplifier 28 supplies the low-level signal to the output circuit 29, which in turn outputs the low-level signal.

According to the second embodiment, as hereinabove described, the global signal line GS common to the word line groups G0 to G15 links the local signal lines LS connected to the source regions of the selection transistors 22 and the sense amplifier 28 with each other, whereby the number of signal lines can be reduced as compared with a case of linking the source regions of the selection transistors 22 and the sense amplifier 28 with each other through 1024 signal lines arranged for the 1024 word lines WL respectively. Thus, the capacity of the signal lines connected to the sense amplifier 28 can be so reduced that the crosspoint diode ROM can operate at a higher speed.

According to the second embodiment, as hereinabove described, the signal lines LS and GS connected to the source regions of the selection transistors 22 are so divided as to increase the operating speed of the crosspoint diode ROM. Therefore, the local signal lines LS and the global signal GS isolable from each other through the interlayer dielectric film 48 may not be arranged at prescribed intervals in a direction parallel to the surface of the p-type silicon substrate 41. Thus, the plane area of the memory cell array 21 can be inhibited from increase.

The remaining effects of the second embodiment are similar to those of the aforementioned first embodiment.

Third Embodiment

Referring to FIGS. 7 to 10, a crosspoint diode ROM according to a third embodiment of the present invention includes a word line control circuit 66, dissimilarly to the aforementioned first embodiment.

Figure 7:
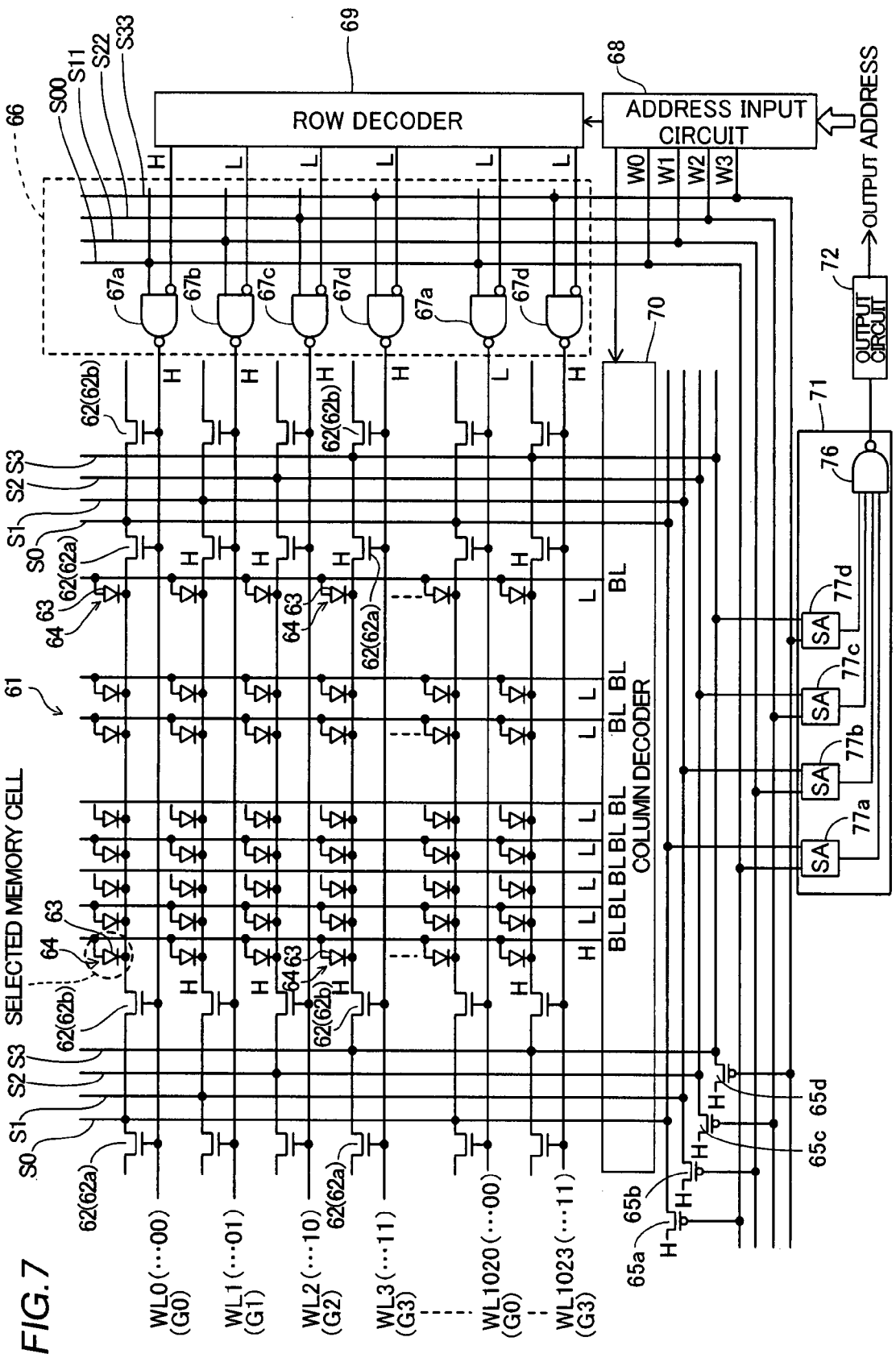
FIG. 7 is a circuit diagram showing the structure of a crosspoint diode ROM according to a third embodiment of the present invention.

In the diode ROM according to the third embodiment, a plurality of word lines WL and a plurality of bit lines BL are arranged in a memory cell array 61 to intersect with each other similarly to the aforementioned first embodiment, as shown in FIG. 7. FIG. 7 illustrates only the word lines WL having serial numbers 0 to 3, 1020 and 1023 included in 1024 word lines WL.

The 1024 word lines WL are classified into four word line groups G0 to G3 each including 256 word lines WL, similarly to the aforementioned first embodiment. The gate electrodes of a prescribed number of selection transistors 62 are connected to each word line WL at prescribed intervals. The selection transistors 62 are similar in structure to the selection transistors 2 according to the aforementioned first embodiment.

A plurality of memory cells 64 each including a diode 63 are provided in the memory cell array 61. The diodes 63 and the memory cells 64 are similar in structure to the diodes 3 and the memory cells 4 according to the aforementioned first embodiment respectively.

According to the third embodiment, p-channel transistors 65a to 65d are arranged one by one for four signal lines S0 to S3 respectively. The signal lines S0 to S3 are examples of the "first signal line" in the present invention, and the p-channel transistors 65a to 65d are examples of the "third transistor" in the present invention. More specifically, the p-channel transistor 65a has a drain connected to the signal line S0 and a gate connected to another signal line S00. The p-channel transistor 65b has a drain connected to the signal line S1 and a gate connected to another signal line S11. The p-channel transistor 65c has a drain connected to the signal line S2 and a gate connected to another signal line S22. The p-channel transistor 65d has a drain connected to the signal line S3 and a gate connected to another signal line S33. The sources of the p-channel transistors 65a to 65d are supplied with high-level signals. The remaining structures of the signal lines S0 to S3 are similar to those of the signal lines S0 to S3 according to the aforementioned first embodiment.

According to the third embodiment, the word line control circuit 66 for controlling the potentials of the word lines WL is provided between the plurality of word lines WL and a row decoder 69. The word line control circuit 66 is an example of the "word line control portion" in the present invention. This word line control circuit 66 is constituted of the four signal lines S00 to S33 and a plurality of two-input NAND circuits 67a to 67d provided in correspondence to the four signal lines S00 to S33 respectively. The signal lines S00 to S33 are examples of the "second signal line" in the present invention. The two-input NAND circuits 67a are arranged one by one for the word lines WL (having addresses with lower digits (bits) (0,0)) included in the first word line group G0 corresponding to the first signal line S00 respectively. The two-input NAND circuit 67b are arranged one by one for the word lines WL (having addresses with lower digits (bits) (0,1)) included in the second word line group G1 corresponding to the second signal line S11 respectively. The two-input NAND circuits 67c are arranged one by one for the word lines WL (having addresses with lower digits (bits) (1,0)) included in the third word line group G2 corresponding to the third signal line S22 respectively. The two-input NAND circuit 67d are arranged one by one for the word lines WL (having addresses with lower digits (bits) (1,1)) included in the fourth word line group G3 corresponding to the fourth signal line S33 respectively.

First input terminals of the two-input NAND circuits 67a corresponding to the first word line group G0 are connected to the signal line S00, while first input terminals of the two-input NAND circuits 67b corresponding to the second word line group G1 are connected to the signal line S11. First input terminals of the two-input NAND circuits 67c corresponding to the third word line group G2 are connected to the signal line S22, while first input terminals of the two-input NAND circuits 67d corresponding to the fourth word line group G3 are connected to the signal line S33. Second input terminals of the two-input NAND circuits 67a to 67d are connected to corresponding output terminals of the row decoder 69 through inverter circuits respectively. Output terminals of the two-input NAND circuits 67a to 67d are connected to the corresponding word lines WL respectively.

When a prescribed word line WL is selected in the crosspoint diode ROM according to the third embodiment, the row decoder 69 supplies a high-level signal to the signal line, included in the signal lines S00 to S33, corresponding to the word line group (G0 in the third embodiment) including the selected word line WL. On the other hand, the row decoder 69 supplies low-level signals to the signal lines, included in the signal lines S00 to S33, corresponding to the remaining three word line groups (G1 to G3 in the third embodiment) not including the selected word line WL. The signal lines S00 to S33 are supplied with signals W0 to W3 respectively.

An address input circuit 68, the row decoder 69, a column decoder 70, a data determination circuit 71 and an output circuit 72 are provided outside the memory cell array 61. The data determination circuit 71 is an example of the "data determination portion" in the present invention. The address input circuit 68 has a function of supplying address data to the row decoder 69 and the column decoder 70 in response to a prescribed address externally received therein. In other words, a signal line control circuit 73 (see FIG. 8) for generating signals corresponding to the externally received address is provided in the address input circuit 68. This signal line control circuit 73 has a function of controlling the potentials of the signals W0 to W3 on the basis of the lower two digits (bits) of the address corresponding to the selected word line WL.

Figure 8:
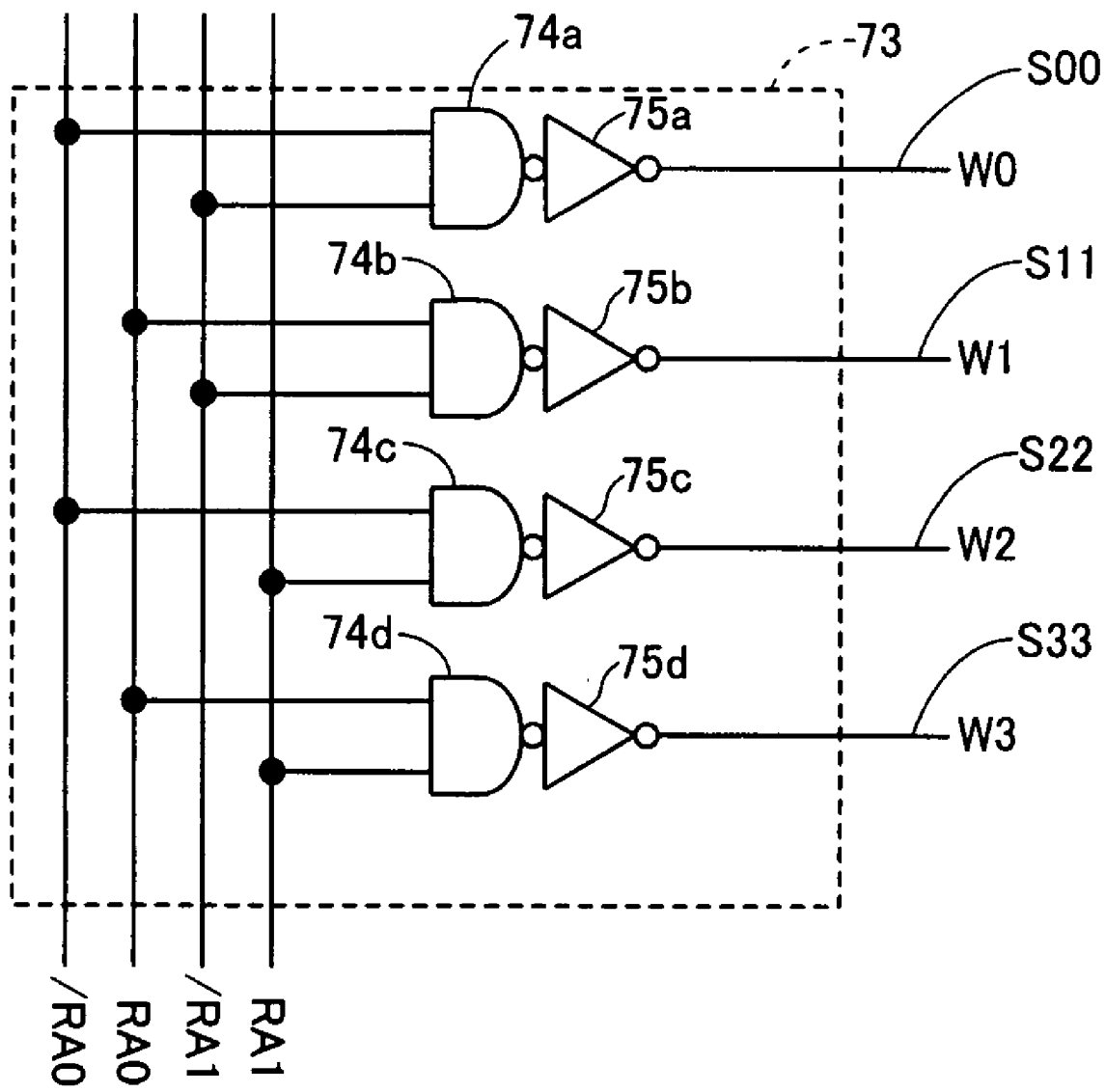
FIG. 8 is a circuit diagram showing the structure of a signal line control circuit of the diode ROM according to the third embodiment shown in FIG. 7.

Referring to FIG. 8, symbols RA0 and RA1 denote signals based on the first and second digits (bits) of the address corresponding to the selected word line WL respectively. Symbols /RA0 and /RA1 denote inverted signals obtained by inverting the potentials of the signals RA0 and RA1 respectively. When the lower digits (bits) of the address corresponding to the selected word line WL are (0,0), both of the signals RA0 and RA1 have low-level potentials while both of the signals /RA0 and /RA1 have high-level potentials. When the lower digits (bits) of the address corresponding to the selected word line WL are (0,1), the signals RA0 and RA1 have high- and low-level potentials respectively while the signals /RA0 and /RA1 have low- and high-level potentials respectively. When the lower digits (bits) of the address corresponding to the selected word line WL are (1,0), the signals RA0 and RA1 have low- and high-level potentials respectively, while the signals /RA0 and /RA1 have high- and low-level potentials respectively. When the lower digits (bits) of the address corresponding to the selected word line WL are (1,1), both of the signals RA0 and RA1 have high-level potentials, while both of the signals /RA0 and /RA1 have low-level potentials.

The signal line control circuit 73 includes two-input NAND circuits 74a to 74d and four inverter circuits 75a to 75d, as shown in FIG. 8. The two-input NAND circuit 74a receives the signals /RA0 and /RA1 in first and second input terminals thereof respectively. The two-input NAND circuit 74b receives the signals RA0 and /RA1 in first and second input terminals thereof respectively. The two-input NAND circuit 74c receives the signals /RA0 and RA1 in first and second input terminals thereof respectively. The two-input NAND circuit 74d receives the signals RA0 and RA1 in first and second input terminals thereof respectively. Input terminals of the inverter circuits 75a to 75d are connected to output terminals of the two-input NAND circuits 74a to 74d respectively. The signal lines S00 to S33 are connected to output terminals of the inverter circuits 75a to 75d respectively.

According to the third embodiment, the column decoder 70 has a function of supplying signals having prescribed potentials to the bit lines BL connected thereto, as shown in FIG. 7. More specifically, the column decoder 70 is so formed as to select a prescribed bit line BL on the basis of the address data supplied from the address input circuit 68, for supplying a high-level signal to the selected bit line BL while supplying low-level signals to the nonselected bit lines BL. The high-level signal supplied to the selected bit line BL is an example of the "signal of a first potential", and the low-level signals supplied to the nonselected bit lines BL are examples of the "signal of a second potential" in the present invention.

The data determination circuit 71 has a function of determining the potential of data (signal) read from a selected memory cell 64 and supplying a signal responsive to the result of this determination to the output circuit 72. More specifically, the data determination circuit 71 supplies a low-level signal to the output circuit 72 when the data held in the selected memory cell 64 is at a high level, while supplying a high-level signal to the output circuit 72 when the data held in the selected memory cell 64 is at a low level. The output circuit 72 has a function of outputting a signal in response to the signal output from the data determination circuit 71. More specifically, the output circuit 72 outputs a high-level signal when the data determination circuit 71 outputs a low-level signal, while outputting a low-level signal when the data determination circuit 71 outputs a high-level signal.

The data determination circuit 71 includes a four-input NAND circuit 76 and sense amplifiers 77a to 77d. The four-input NAND circuit 76 has an input terminal connected to output terminals of the sense amplifiers 77a to 77d and an output terminal connected to the output circuit 72. The sense amplifiers 77a to 77d have first input terminals connected with the signal lines S00 to S33 respectively and second input terminals connected with the signal lines S0 to S3 respectively. The sense amplifiers 77a to 77d output high-level signals to the input terminal of the four-input NAND circuit 76 when the first input terminals thereof are supplied with low-level signals, while outputting high- or low-level signals to the input terminal of the four-input NAND circuit 76 in response to signals from the second input terminals when the first input terminals thereof are supplied with high-level signals.

Figure 9:
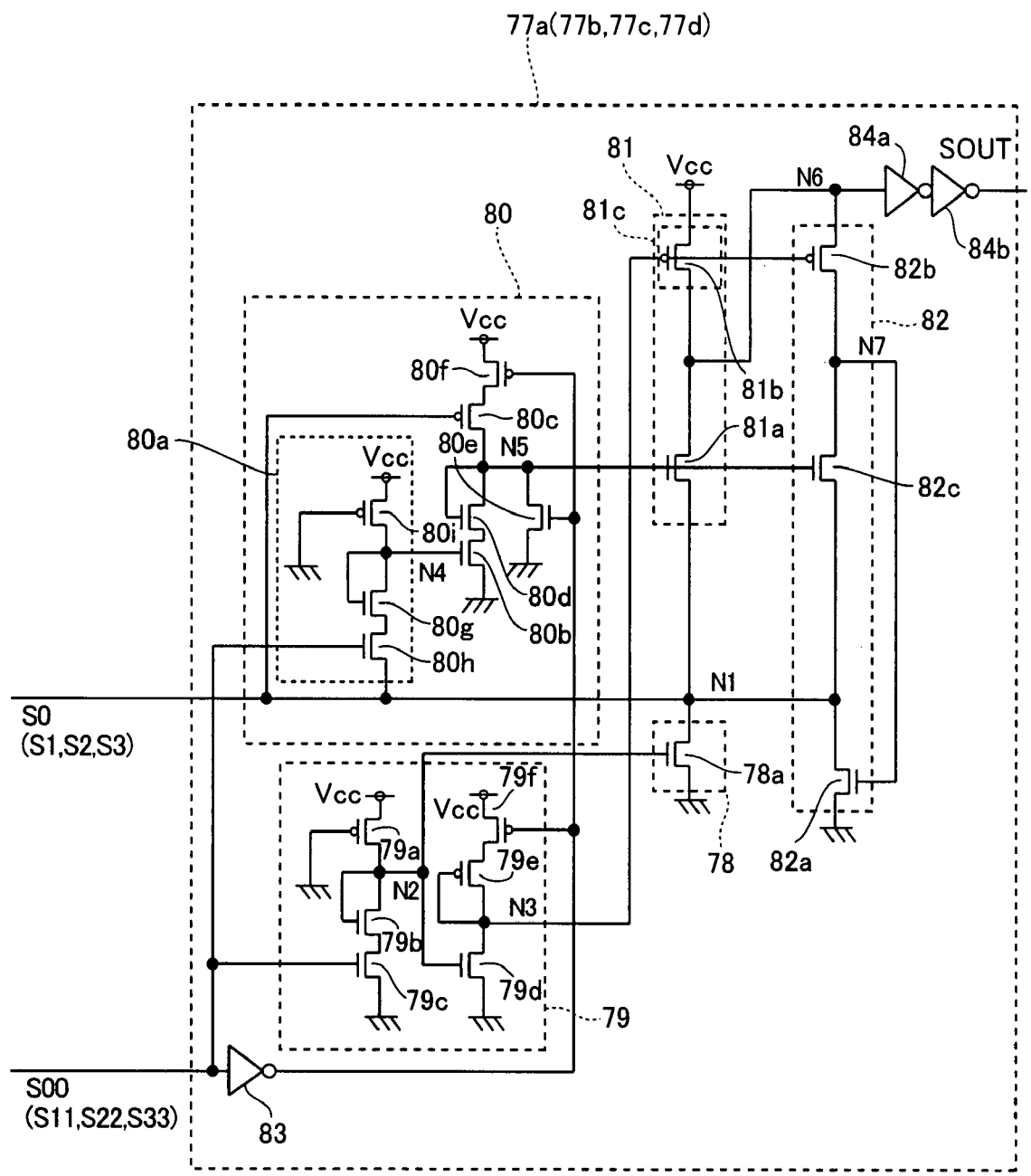
FIG. 9 is a circuit diagram showing the structure of a sense amplifier of the diode ROM according to the third embodiment shown in FIG. 7.
Figure 10:
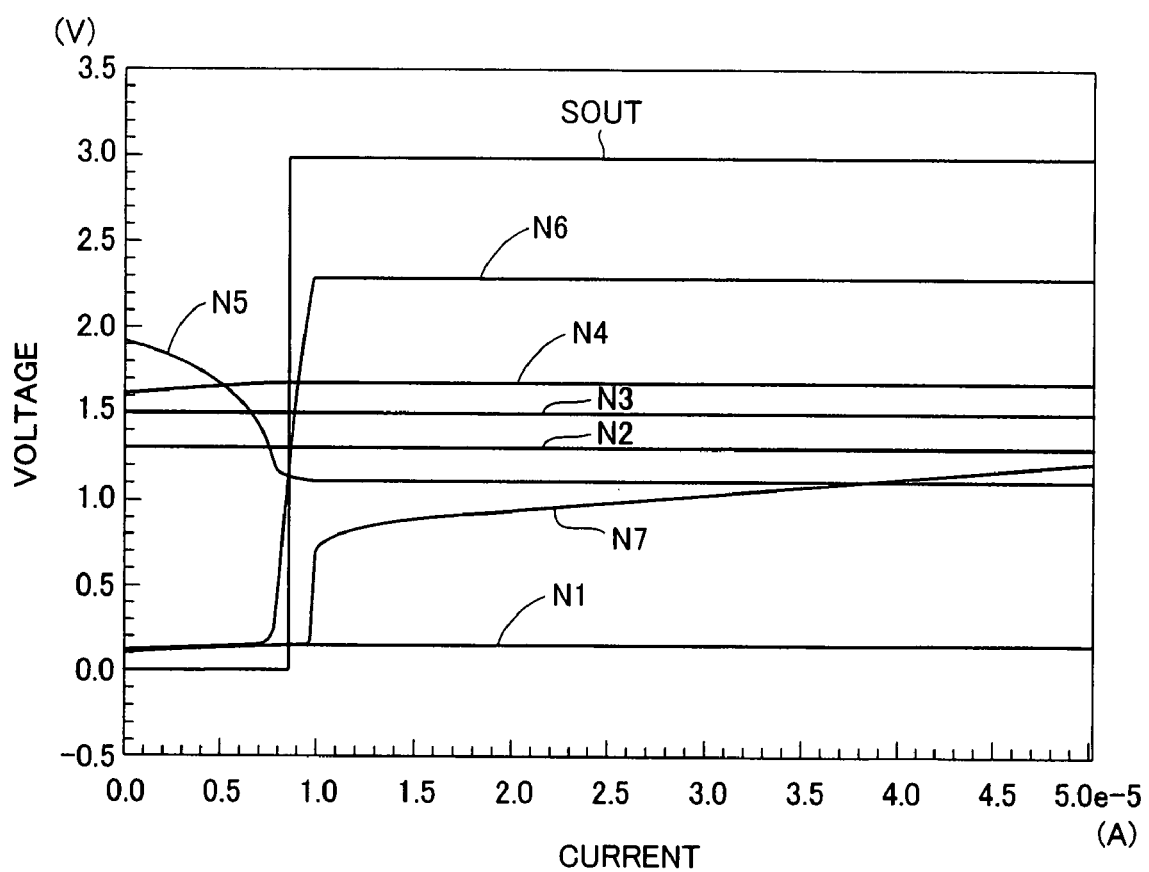
FIG. 10 is a graph showing the relation between a current flowing into a node N1 and the potentials of nodes N1 to N7 and an output signal SOUT obtained by a simulation.
Figure 11:
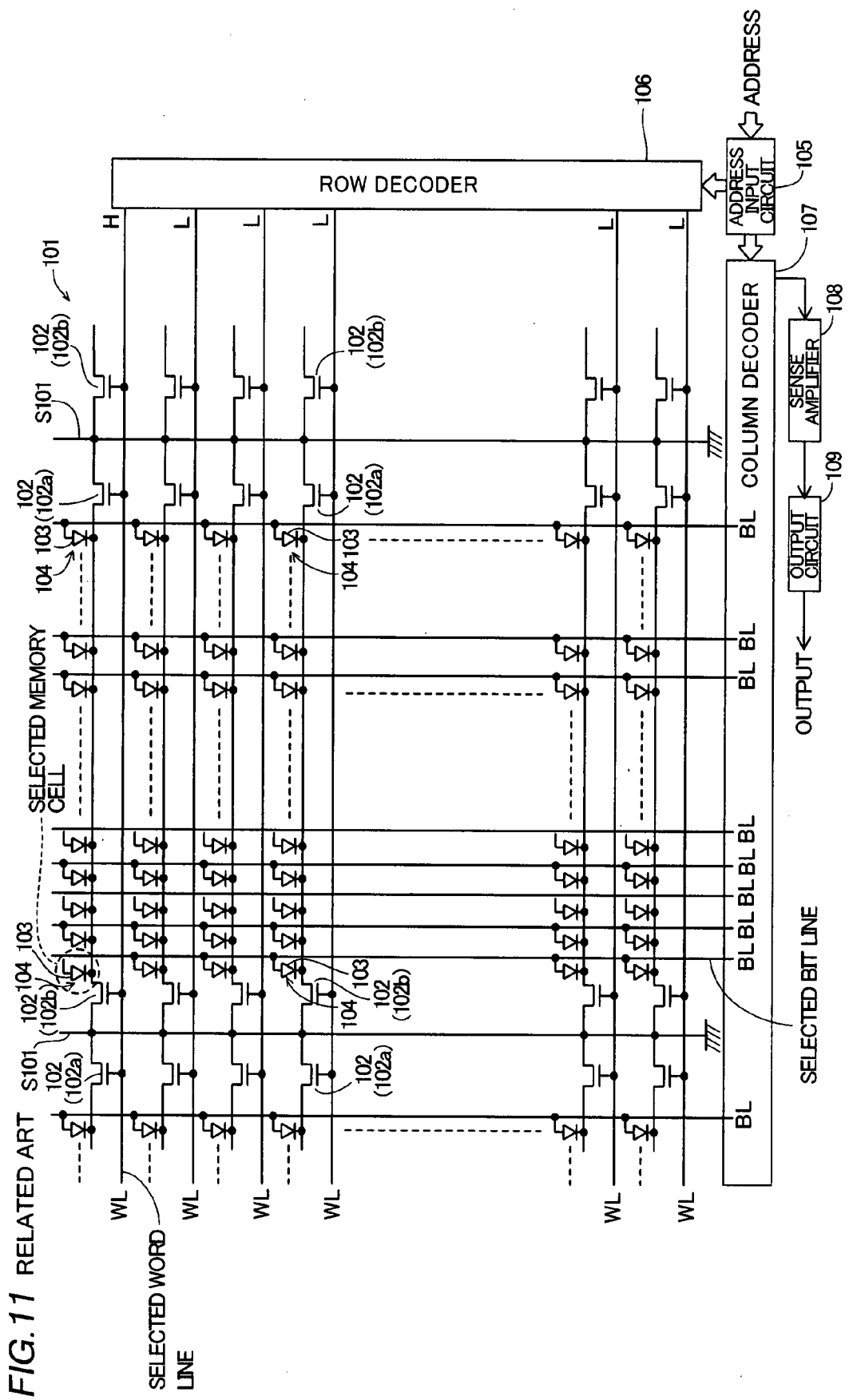
FIG. 11 is a circuit diagram showing the structure of a conventional crosspoint diode ROM.

As shown in FIGS. 9 and 10, each sense amplifier 77a (77b, 77c or 77d) includes a load circuit 78, a bias circuit 79, an inverting amplifier 79, a current-to-voltage conversion circuit 81, a feedback circuit 82 and three inverter circuits 83, 84a and 84b.

The load circuit 78 includes an n-channel transistor 78a functioning as a load resistance. The gate of the n-channel transistor 78a, connected to a node N2 described later, is supplied with a prescribed bias potential. The drain of the n-channel transistor 78a is connected to another node N1 linked to the signal line S0 (S1, S2 or S3) while the source thereof is grounded to be supplied with a GND potential. The term "GND potential" indicates a low-level potential. Thus, the node N1 is supplied with the GND potential through the n-channel transistor 78a before the selected bit line BL is supplied with a high-level signal, to reach a potential (about 0.10 V in the third embodiment) close to the GND potential. The potential of the node N1 is at an exemplary value in a case where a potential Vcc is about 3 V in the third embodiment. This also applies to the potentials of the node N2 and remaining nodes N3 to N7 described later.

According to the third embodiment, the bias circuit 79 includes a p-channel transistor 79a, n-channel transistors 79b and 79c, still another n-channel transistor 79d and other p-channel transistors 79e and 79f. The source of the p-channel transistor 79a is supplied with the potential Vcc, while the gate thereof is grounded to be supplied with the GND potential. The drain of the p-channel transistor 79a is connected to the node N2. The gate and the drain of the n-channel transistor 79b are interconnected with each other, and connected to the node N2. The source of the n-channel transistor 79b is connected with the drain of the n-channel transistor 79c. The n-channel transistor 79b has a function of inhibiting the potential of the node N2 from lowering beyond the threshold voltage of the n-channel transistor 79b. The source of the n-channel transistor 79c is grounded to be supplied with the GND potential, while the gate thereof is connected with the signal line S00 (S11, S22 or S33). The n-channel transistor 79c is so formed as to enter an ON-state when the gate thereof is supplied with a high-level signal W0 (W1, W2 or W3) while entering an OFF-state when the gate is supplied with a low-level signal W0 (W1, W2 or W3).

Thus, the node N2 is supplied with a bias potential (about 1.30 V in the third embodiment) corresponding to the threshold voltage $Vt_{79b}+\alpha_3$ of the n-channel transistor 79b when the gate of the n-channel transistor 79c is supplied with the high-level signal W0 (W1, W2 or W3), and supplied with the potential Vcc when the gate of the n-channel transistor 79c is supplied with the low-level signal W0 (W1, W2 or W3). The potential $Vt_{79b}+\alpha_3$ (gate potentials of the n-channel transistors 78a and 79d) of the node N2 is set to be higher than the threshold voltages of the n-channel transistors 78a and 78d and lower than the potential Vcc.

According to the third embodiment, the gate of the n-channel transistor 79d of the bias circuit 79 is connected to the node N2. The drain of the n-channel transistor 79d is connected to the node N3, while the source thereof is grounded to be supplied with the GND potential. The gate and the drain of the p-channel transistor 79e are interconnected with each other, and connected to the node N3. The source of the p-channel transistor 79e is connected to the drain of the p-channel transistor 79f. The source of the p-channel transistor 79f is supplied with the potential Vcc, while the gate thereof is supplied with an output of the inverter circuit 83. The p-channel transistor 79f is so formed as to enter an ON-state when the gate thereof is supplied with a low-level output of the inverter circuit 83 while entering an OFF-state when the gate is supplied with a high-level output of the inverter circuit 73. Thus, the node N3 is supplied with a bias potential (about 1.50 V according to the third embodiment) corresponding to a potential $Vcc-Vt_{79e}-\alpha_4$ lower than the potential Vcc by the threshold voltage of the p-channel transistor 79e when the gate of the p-channel transistor 79f receives a low-level output signal from the inverter circuit 83, and supplied with the GND potential when the gate of the p-channel transistor 79f receives a high-level output signal from the inverter circuit 73. The potential $Vcc-Vt_{79e}-\alpha_4$ (gate potentials of p-channel transistors 81b and 82b described later) of the node N3 is so set that the potential difference between the sources and the gates of the p-channel transistors 81b and 82b is larger than the threshold voltages.

According to the third embodiment, the inverting amplifier 80 includes a potential control circuit 80a for controlling the potential of the node N4, an n-channel transistor 80b and a p-channel transistor 80c for controlling the potential of the node N5 and a p-channel transistor 80f.

The potential control circuit 80a of the inverting amplifier 80 includes n-channel transistors 80g and 80h and a p-channel transistor 80i. The gate and the drain of the n-channel transistor 80g are interconnected with each other, and connected to the node N4. The drain of the n-channel transistor 80h is connected to the source of the n-channel transistor 80g. The n-channel transistor 80g has a function of inhibiting the potential of the node N4 from lowering beyond the threshold voltage of the n-channel transistor 80g. The gate of the n-channel transistor 80h is connected with the signal line S00 (S11, S22 or S33), and the source thereof is connected to the node N1. The n-channel transistor 80h is so formed as to enter an ON-state when the gate thereof receives a high-level signal W0 (W1, W2 or W3), while entering an OFF-state when the gate receives a low-level signal W0 (W1, W2 or W3). The gate of the p-channel transistor 80i is grounded to be supplied with the GND potential. The drain of the p-channel transistor 80i is connected to the node N4, while the source thereof is supplied with the potential Vcc.

Thus, the node N4 is supplied with a potential close to a level shifting up (rising) from the potential of the node N1 by the threshold voltage of the n-channel transistor 80g when the gate of the n-channel transistor 80h receives the high-level signal W0 (W1, W2 and W3), and supplied with the potential Vcc when the gate of the n-channel transistor 80h receives the low-level signal W0 (W1, W2 and W3). In other words, the node N4 is so formed that the potential thereof is about 1.62 V when the gate of the n-channel transistor 80h receives the high-level signal W0 (W1, W2 and W3) and the potential of the node N1 is about 0.10 V, and is about 1.67 V when the potential of the node N1 rises to about 0.15 V from the level of about 0.10 V in data reading.

The gate of the n-channel transistor 80b of the inverting amplifier 80 is connected to the node N4. The drain of the n-channel transistor 80b is connected to the source of the n-channel transistor 80d, while the source thereof is grounded to be supplied with the GND potential. The gate of the p-channel transistor 80c is connected to the node N1. The drain of the p-channel transistor 80c is connected to the node N5, while the source thereof is connected to the drain of the p-channel transistor 80f. The gate and the drain of the n-channel transistor 80d are interconnected with each other, and connected to the node N5. The n-channel transistor 80d has a function of inhibiting the potential of the node N5 from lowering beyond the threshold voltage of the n-channel transistor 80d. The drain of the n-channel transistor 80e is connected to the node N5, while the source thereof is grounded to be supplied with the GND potential. The gate of the n-channel transistor 80e is supplied with the output of the inverter circuit 83. The n-channel transistor 80e is so formed as to enter an OFF-state when the gate thereof is supplied with a low-level output of the inverter circuit 83 while entering an ON-state when the gate is supplied with a high-level output of the inverter circuit 83. The source of the p-channel transistor 80f is supplied with the potential Vcc, while the gate thereof is supplied with the output from the inverter circuit 83. The p-channel transistor 80f is so formed as to enter an ON-state when the gate thereof is supplied with the low-level output of the inverter circuit 83 while entering an OFF-state when the gate is supplied with the high-level output of the inverter circuit 83.

Thus, the node N5 is supplied with the GND potential when the gates of the n-channel transistor 80e and the p-channel transistor 80f receive the high-level output signal from the inverter circuit 83. When the inverter circuit 83 receives the low-level signal W0 (W1, W2 or W3), therefore, n-channel transistors 81a and 82c described later enter OFF-states, thereby inhibiting a current from flowing through the n-channel transistors 81a and 82c.

When the gates of the n-channel transistor 80e and the p-channel transistor 80f receive the low-level output signal from the inverter circuit 83 while the potential of the node N1 is set to about 0.10 V, the gates of the n-channel transistor 80b and the p-channel transistor 80c receive potentials of about 1.62 V and about 0.10 V respectively, whereby the potential (gate potentials of the n-channel transistors 81a and 82c) of the node N5 resulting from resistance division between the p-channel transistor 80c and the n-channel transistors 80b and 80d connected between the potential Vcc and the GND potential reaches a level (about 1.92 V according to the third embodiment) bringing the n-channel transistors 81a and 82c into ON-states. When the potential of the node N1 rises to about 0.15 V from the level of about 0.10 V in data reading, the potential of the node N4 rises to about 1.67 V from about 1.62 V so that the impedances of the n-channel transistor 80b and the p-channel transistor 80c lowers and rises respectively, whereby the potential of the node N5 resulting from resistance division between the p-channel transistor 80c and the n-channel transistors 80b and 80d connected between the potential Vcc and the GND potential lowers to a level (about 1.10 V according to the third embodiment) bringing the n-channel transistors 81*a* and 82*c* into states close to OFF-states. At this time, the n-channel transistors 81*a* and 82*c* rapidly shift from ON-states to the states close to OFF-states due to the rise of the potential, serving as a source potential, of the node N1.

The current-to-voltage conversion circuit 81 includes the n-channel transistor 81*a* for controlling the potential of the node N6 linked to an input side of the inverter circuit 84*a* and a load circuit 81*c* having the p-channel transistor 81*b* serving as a load resistance. The gate of the n-channel transistor 81*a* is connected to the node N5. The source of the n-channel transistor 81*a* is connected to the node N1, while the drain thereof is connected to the node N6 and the drain of the p-channel transistor 81*b*. The gate of the p-channel transistor 81*b* is connected to the node N3. The drain of the p-channel transistor 81*b* is connected to the node N6, while the source thereof is supplied with the potential Vcc. When the n-channel transistor 81*a* is in an ON-state, therefore, the impedance of the n-channel transistor 81*a* is lower than that of the p-channel transistor 81*b*, whereby the potential of the node N6 resulting from resistance division between the n-channel transistors 78*a* and 81*a* and the p-channel transistor 81*b* connected between the potential Vcc and the GND potential reaches a level (about 0.12 V according to the third embodiment) close to the potential of the node N1. When the n-channel transistor 81*a* is in the state close to an OFF-state, on the other hand, the impedance of the n-channel transistor 81*a* is higher than that of the p-channel transistor 81*b*, whereby the potential of the node N6 resulting from resistance division between the n-channel transistors 78*a* and 81*a* and the p-channel transistor 81*b* connected between the potential Vcc and the GND potential rises to about 2.30 V.

According to the third embodiment, the feedback circuit 82 includes an n-channel transistor 82*a* for controlling the potential of the node N1, the p-channel transistor 82*b* and the n-channel transistor 82*c* for controlling the potential of the node N7. The gate of the n-channel transistor 82*a* is connected to the node N7. The source of the n-channel transistor 82*a* is grounded to be supplied with the GND potential, while the drain thereof is connected to the node N1. The gate of the p-channel transistor 82*b* is connected to the node N3. The source and the drain of the p-channel transistor 82*b* are connected to the nodes N6 and N7 respectively. The gate of the n-channel transistor 82*c* is connected to the node N5. The source and the drain of the n-channel transistor 82*c* are connected to the nodes N1 and N7 respectively.

When the n-channel transistor 82*c* is in an ON-state, therefore, the impedance of the n-channel transistor 82*c* is lower than those of the p-channel transistors 81*b* and 82*b*, whereby the potential of the node N7 resulting from resistance division between the n-channel transistors 78*a* and 82*c* and the p-channel transistors 81*b* and 82*b* connected between the potential Vcc and the GND potential reaches a level (about 0.10 V according to the third embodiment) close to the potential of the node N1. When the n-channel transistor 82*c* is in the state close to an OFF-state, on the other hand, the impedance of the n-channel transistor 82*c* is higher than those of the p-channel transistors 81*b* and 82*b*, whereby the potential of the node N7 resulting from resistance division between the n-channel transistors 78*a* and 82*c* and the p-channel transistors 81*b* and 82*b* connected between the potential Vcc and the GND potential rises. In this case, the n-channel transistor 82*a* enters an ON-state, whereby the potential of the node N7 reaches about 1.15 V due to resistance division between the n-channel transistors 78*a*, 82*a* and 82*c* and the p-channel transistors 82*b* and 81*b*. When the n-channel transistor 82*c* is in the state close to an OFF-state, therefore, the n-channel transistor 82*a* so enters an ON-state that the node N1 is supplied with the GND potential through the n-channel transistor 82*a*. When the n-channel transistor 82*c* is in an ON-state, on the other hand, the n-channel transistor 82*a* so enters an OFF-state that the node N1 is not supplied with the GND potential through the n-channel transistor 82*a*.

The inverter circuit 83 is so formed as to receive a high- or low-level signal W0 (W1, W2 or W3). The inverter circuits 84*a* and 84*b* are so formed as to output a high- or low-level output signal SOUT to the four-input NAND circuit 76 in response to the potential of the node N6. When the inverter circuit 83 receives a low-level signal W0 (W1, W2 or W3), the n-channel transistors 81*a* and 82*c* enter OFF-states while the p-channel transistors 81*c* and 82*b* enter ON-states, so that the sense amplifier 77*a* (77*b*, 77*c* or 77*d*) outputs a high-level output signal SOUT to the four-input NAND circuit 76.

A data read operation of the crosspoint diode ROM according to the third embodiment is now described with reference to FIGS. 7 and 8. In the following description of the read operation, it is assumed that a memory cell 64 (hereinafter referred to as a selected memory cell 64) enclosed with a broken line in FIG. 7 is selected. In the following description of the read operation, it is also assumed that the address of the selected word line WL (WL0 in FIG. 7) has 10 digits (bits) (0,0,0,0,0,0,0,0,0,0). In the following description of the read operation, further, the memory cells 64 other than the selected memory cell 64 are referred to as nonselected memory cells 64. In the following description of the read operation, further, the selected word line WL is referred to as the selected word line WL0, while the remaining word lines WL are referred to as nonselected word lines WL. In the following description of the read operation, further, the bit lines BL other than the selected bit line BL are referred to as nonselected bit lines BL.

As shown in FIG. 7, the address corresponding to the selected memory cell 64 is externally input in the address input circuit 68. Thus, the address input circuit 68 outputs address data, which in turn is supplied to the row decoder 69 and the column decoder 70.

Thereafter the row decoder 69 selects the prescribed word line WL (hereinafter referred to as the selected word line WL0) on the basis of the address data. The address corresponding to the selected word line WL0 has lower digits (bits) (0,0). Thus, the row decoder 69 outputs a high-level signal from an output terminal corresponding to the selected word line WL0 while outputting low-level signals from output terminals corresponding to the nonselected word lines WL other than the selected word line WL0.

At this time, the signal line control circuit 73 shown in FIG. 8 operates as follows: The lower digits (bits) of the address corresponding to the selected word line WL0 are (0,0), whereby both of the potentials of the signals RA0 and RA1 go low while those of the signals /RA0 and /RA1 go high. Thus, the two-input NAND circuit 74*a* receives the high-level signals /RA0 and /RA1 in the first and second input terminals respectively, thereby outputting a low-level signal from the output terminal thereof. The two-input NAND circuit 74*b* receives the low- and high-level signals RA0 and /RA1 in the first and second input terminals respectively, thereby outputting a high-level signal from the output terminal thereof. The two-input NAND circuit 74*c* receives the high- and low-level signals /RA0 and RA1 in the first and second input terminals respectively, thereby outputting a high-level signal from the output terminal thereof. The two-input NAND circuit 74*d* receives the low-level signals RA0 and RA1 in the first and second input terminals respectively, thereby outputting a high-level signal from the output terminal thereof.

The signals output from the output terminals of the two-input NAND circuits 74a to 74d are input in the input terminals of the inverter circuits 75a to 75d respectively. Thus, the inverter circuit 75a inverts the low-level signal and outputs a high-level signal W0 from the output terminal thereof. The inverter circuits 75b to 75d invert the high-level signals and output low-level signals W1 to W3 from the output terminals thereof respectively. Consequently, the signal line S00 is supplied with the high-level signal W0. On the other hand, the signal lines S11 to S33 are supplied with the low-level signals W1 to W3 respectively.

Thus, the word line control circuit 66 shown in FIG. 7 operates as follows: In the word line group G0 including the selected word line WL0, the first input terminal of the two-input NAND circuit 67a corresponding to the selected word line WL0 receives the high-level signal W0 through the signal line S00 while the second input terminal receives a low-level signal generated by inverting the high-level signal from the row decoder 69. Thus, the two-input NAND circuit 67a connected with the selected word line WL0 outputs a high-level signal from the output terminal thereof in the word line group G0 including the selected word line WL0, whereby the potential of the selected word line WL0 goes high.

In the word line group G0 including the selected word line WL0, further, the first input terminals of the two-input NAND circuits 67a corresponding to the nonselected word lines WL receive the high-level signal W0 through the signal line S00 while the second input terminals receive high-level signals generated by inverting the low-level signals from the row decoder 79. Thus, the output terminals of the two-input NAND circuits 67a connected with the nonselected word lines WL output low-level signals from the output terminals thereof in the word line group G0 including the selected word line WL0, whereby the potentials of the nonselected word lines WL go low.

In the word line groups G1 to G3 not including the selected word line WL0, the first input terminals of the two-input NAND circuits 67b to 67d corresponding to the nonselected word lines WL receive the low-level signals W1 to W3 through the signal lines S11 to S33 respectively while the second input terminals receive high-level signals generated by inverting the low-level signals from the row decoder 69. Thus, the two-input NAND circuits 67b to 67d connected with the nonselected word lines WL output high-level signals from the output terminals thereof in the word line groups G1 to G3 not including the selected word line WL0, whereby the potentials of the nonselected word lines WL go high.

The potentials of the word lines WL are so controlled in the aforementioned manner that the potential of the gate electrode of the selection transistor 62 (n-channel transistors 62a and 62b) corresponding to the selected word line WL0 goes high in the word line group G0 including the selected word line WL0, whereby this selection transistor 62 enters an ON-state. In the word line group G0 including the selected word line WL0, further, the potentials of the gate electrodes of the selection transistors 62 corresponding to the nonselected word lines WL go low, whereby the selection transistors 62 enter ON-states. In the word line groups G1 to G3 not including the selected word line WL0, the potentials of the gate electrodes of the selection transistors 62 corresponding to the nonselected word lines WL go high, whereby the selection transistors 62 enter ON-states.

The signal line S00 is supplied with the high-level signal W0, while the signal lines S11 to S33 are supplied with the low-level signals W1 to W3 respectively. Thus, the p-channel transistor 65a enters an OFF-state, so that no high-level signal is supplied to the signal line S0 through the p-channel transistor 65a. On the other hand, the p-channel transistors 65b to 65d enter ON-states, so that high-level signals are supplied to the signal lines S1 to S3 through the p-channel transistors 65b to 65d respectively.

The column decoder 70 supplies signals having prescribed potentials to the bit lines BL connected thereto on the basis of the address data. More specifically, the column decoder 70 supplies a high-level signal to only the selected bit line BL, while supplying low-level signals to the nonselected bit lines BL.

The row decoder 69 and the column decoder 70 operate in the aforementioned manner, thereby supplying the data (signal) held in the selected memory cell 64 to the signal line S0 through the corresponding ON-state selection transistor 62. More specifically, the anode of the diode 63 included in the selected memory cell 64 is connected to the selected bit line BL according to the third embodiment, whereby the high-level signal supplied to the selected bit line BL is transmitted to the signal line S0. If the anode of the diode 63 included in the selected memory cell 64 is not connected to the selected bit line BL, however, the high-level signal supplied to the selected bit line BL is not transmitted to the signal line S0. In the word line group G0 including the selected word line WL0, data held in the nonselected memory cells 64 connected to the nonselected word lines WL as well as to the selected bit line BL are not transmitted to the signal line S0 since the corresponding selection transistors 62 are in OFF-states. In the word line groups G1 to G3 not including the selected word line WL0, the cathodes of the diodes 63 included in the nonselected memory cells 64 corresponding to the nonselected word lines WL are supplied with high-level signals through the p-channel transistors 65b to 65d, the signal lines S1 to S3 and the corresponding selection transistors 62 respectively. The high-level signals supplied to the cathodes of the diodes 63 have potentials lower than that of the high-level signal supplied to the selected bit line BL. The high-level signals supplied to the cathodes of the diodes 63 included in the nonselected memory cells 64 corresponding to the word line groups G1 to G3 not including the selected word line WL0 are examples of the "signal of a third potential" in the present invention.

At this time, the first input terminal of the sense amplifier 77a corresponding to the word line group G0 is supplied with the high-level signal W0 corresponding to the word line group G0 while the first input terminals of the sense amplifiers 77b to 77d corresponding to the word line groups G1 to G3 are supplied with the low-level signals W1 to W3 corresponding to the word line groups G1 to G3 respectively in the data determination circuit 71. Thus, the high-level signal is transmitted to the signal line S0 for the sense amplifier 77a, which in turn supplies the high-level signal to the four-input NAND circuit 76. The sense amplifiers 77b to 77d, supplied with the low-level signals W1 to W3 respectively, supply high-level signals to the four-input NAND circuit 76 respectively. Therefore, the four-input NAND circuit 76 outputs a low-level signal, which in turn is supplied to the output circuit 72. Consequently, the output circuit 72 outputs a high-level signal.

When the anode of the diode 63 included in the selected memory cell 64 is not connected to the selected bit line BL, the second input terminal of the sense amplifier 77a is supplied with a low-level signal through the signal line S0. Therefore, a low-level signal output from the sense amplifier 77a and high-level signals output from the sense amplifiers 77b to 77d are supplied to the four-input NAND circuit 76, which in turn outputs a high-level signal. Consequently, the output circuit 72, supplied with this high-level signal, outputs a low-level signal. Also when the anodes of the diodes 63 are connected to the nonselected bit lines BL in the nonselected memory cells 64 corresponding to the selected word line WL0 in this case, the potentials of the cathodes of the diodes 63 included in the nonselected memory cells 64 do not go high since the nonselected bit lines BL are supplied with low-level signals. In data reading, therefore, no high-level signal is transmitted to the signal line S0 if the anode of the diode 63 included in the selected memory cell 64 is not connected to the selected bit line BL.

According to the third embodiment, as hereinabove described, the signals of high levels (third potential) are supplied to the cathodes of the nonselected memory cells 64 (diodes 63) corresponding to the word line groups G1 to G3 not including the selected word line WL0 in data reading for charging the potentials of the cathodes of the diodes 63 included in the nonselected memory cells 64 corresponding to the word line groups G1 to G3 not including the selected word line WL0 to the high levels (third potential), whereby the potentials of the cathodes of the diodes 63 can be brought into the high levels in a short period through the selected bit line BL supplied with the signal of a high level (first potential). Therefore, the potentials of the cathodes of the diodes 63 may be brought into high levels through the selected bit line BL substantially as to only the nonselected memory cells 64 included in the memory cells 64 corresponding to the word line group G0 including the selected word line WL0, whereby the time for bringing the potential of the selected bit line BL to a high level (first potential) can be reduced. Thus, the period for the read operation can be so reduced that the diode ROM can operate at a higher speed.

According to the third embodiment, further, the four signal lines S00 to S33 corresponding to the four word line groups G0 to G3 respectively are arranged on the word line control circuit 66 for controlling the potentials of the word lines WL thereby controlling the potentials of the signals W0 to W3 for the word line groups G0 to G3 respectively by controlling the corresponding word lines WL on the basis of the potentials of the signals W0 to W3 supplied to the signal lines S00 to S33 respectively in data reading, whereby the potentials of the nonselected word lines WL corresponding to the word line groups G1 to G3 not including the selected word line WL0 can be easily set to levels for turning on the selection transistors 64 connected to the nonselected word lines WL while the potential of the selected word line WL0 corresponding to the word line group G0 including the selected word line WL0 can be easily set to a level for turning on the selection transistor 64 connected to this selected word line WL0.

The remaining effects of the third embodiment are similar to those of the aforementioned first embodiment.

The high-level potentials of the aforementioned nodes N1 to N7 may not be identical to each other.

Although the present invention has been described and illustrated in detail, it is clearly understood that the same is by way of illustration and example only and is not to be taken by way of limitation, the spirit and scope of the present invention being limited only by the terms of the appended claims.

For example, while each of the aforementioned first to third embodiments is applied to the crosspoint diode ROM, the present invention is not restricted to this but is widely applicable to a memory, other than the crosspoint diode ROM, comprising memory cells including diodes having cathodes connected to the source or drain regions of selected transistors.

While the selection transistors are formed by n-channel transistors in each of the aforementioned first to third embodiments, the present invention is not restricted to this but selection transistors formed by p-channel transistors may alternatively be employed.

While the plurality of word lines are classified into the four word line groups on the basis of the lower digits (bits) of the addresses corresponding to the respective word lines in each of the aforementioned first and third embodiments, the present invention is not restricted to this but the plurality of word lines may alternatively be classified into five or more word line groups on the basis of at least three of a plurality of digits (bits) forming each of the addresses corresponding to the respective word lines.

While the signal lines are arranged for the plurality of word line groups respectively and connected to the data determination circuit in the aforementioned first embodiment, the present invention is not restricted to this but the signal lines corresponding to the plurality of word line groups respectively may alternatively be divided into local signal lines and a global signal line so that this global signal line is connected to the data determination circuit.

While the potentials of the high-level signals supplied to the cathodes of the diodes 63 are lower than the potential of the high-level signal supplied to the selected bit line BL in the aforementioned third embodiment, the present invention is not restricted to this but the potentials of the high-level signals supplied to the cathodes of the diodes 63 may alternatively be substantially identical to the potential of the high-level signal supplied to the selected bit line BL.

While the potential Vcc is about 3 V in the aforementioned third embodiment, the present invention is not restricted to this but the potential Vcc may be at a level other than about 3 V. In this case, the potentials of the nodes N1 to N7 shown in the third embodiment vary with the potential Vcc.

What is claimed is:

1. A memory comprising:
    a plurality of word lines;
    first transistors, the respective gate electrodes of which are connected to respective said plurality of word lines for entering an ON-state through selection of corresponding said word line;
    a plurality of memory cells including diodes having cathodes connected to the source or drain regions of said first transistors respectively; and
    a data determination portion connected to the drain or source regions of said first transistors for determining data read from selected said memory cell,
    wherein said plurality of word lines connected with said first transistors respectively are classified into a plurality of word line groups each including a prescribed number of said word lines,
    said memory further comprises first signal lines linking the drain or source regions of said first transistors and said data determination portion with each other, and
    said first signal lines are arranged at least one by one for said plurality of word line groups respectively.

2. The memory cell according to claim 1, further comprising a plurality of bit lines arranged to intersect with said plurality of word lines, wherein
    selected said bit line is supplied with a signal of a first potential and nonselected said bit line is supplied with a signal of a second potential in data reading.

3. The memory according to claim 1, wherein
    said first transistors include pairs of transistors sharing the drain or source regions.

4. The memory according to claim 1, wherein
    said first signal lines are arranged to intersect with said plurality of word lines.

5. The memory according to claim 1, wherein
said plurality of word lines connected with said first transistors respectively are classified into a plurality of word line groups each including a prescribed number of said word lines,
said memory further comprises first signal lines linking the drain or source regions of said first transistors and said data determination portion with each other, and
said first signal lines include:
sub signal lines connected to the drain or source regions of said first transistors and arranged at least one by one for said plurality of word line groups respectively, and
a main signal line, linking said sub signal lines and said data determination portion with each other, common to said plurality of word line groups.

6. The memory according to claim 1, further comprising a plurality of bit lines arranged to intersect with said plurality of word lines, wherein
selected said bit line is supplied with a signal of a first potential and nonselected said bit line is supplied with a signal of a second potential while the cathode of said diode corresponding to prescribed said word line other than selected said word line is supplied with a signal of a third potential in data reading.

7. The memory according to claim 1, wherein
one of said first transistors shares either said source or drain region with adjacent another of said first transistors, and either said source or drain region is arranged along an extensional direction of said word lines.

8. The memory according to claim 5, further comprising second transistors arranged at least one by one for said plurality of word line groups respectively for linking said sub signal lines and said main signal line with each other, wherein
said second transistor corresponding to said word line group including selected said word line is controlled to enter an ON-state, and
said second transistor corresponding to said word line group not including said selected word line is controlled to enter an OFF-state.

9. The memory according to claim 5, wherein
said main signal line is formed on regions of the upper surfaces of said sub signal lines corresponding to said sub signal lines.

10. The memory according to claim 6, wherein
said plurality of word lines connected with said first transistors respectively are classified into a plurality of word line groups each including a prescribed number of said word lines,
said memory further comprises first signal lines arranged at least one by one for said plurality of word line groups respectively for linking the drain or source regions of said first transistors and said data determination portion with each other,
the potential of nonselected said word line is so controlled that corresponding said first transistor enters an ON-state in data reading in said word line group other than said word line group including selected said word line,
the potential of said selected word line is so controlled that corresponding said first transistor enters an ON-state in data reading in said word line group including said selected word line, and the potential of nonselected said word line is so controlled that corresponding said first transistor enters an OFF-state in data reading in said word line group including said selected word line.

11. The memory according to claim 10, wherein
said data determination portion includes sense amplifiers arranged one by one for said word line groups respectively.

12. The memory according to claim 10, further comprising a word line control portion for controlling the potentials of said word lines, wherein
said word line control portion includes second signal lines arranged one by one for said word line groups respectively, and
the potentials of said word lines are controlled on the basis of the potentials of signals supplied to said second signal lines in data reading.

13. The memory according to claim 12, further comprising a third transistor having a gate connected to said second signal lines and a source or drain region connected to said first signal lines.

14. The memory according to claim 12, further comprising a signal line control circuit for controlling the potentials of signals supplied to said second signal lines, wherein
address data corresponding to said selected word line is input in said signal line control circuit, and
said signals supplied to said second signal lines are generated on the basis of said address data corresponding to said selected word line.

15. The memory according to claim 12, wherein
said data determination portion includes sense amplifiers arranged one by one for said word line groups respectively, and
said first signal lines and said second signal lines are connected to said sense amplifiers.

16. The memory according to claim 13, wherein
the cathode of said diode corresponding to said word line group other than said word line group including said selected word line is supplied with a signal corresponding to said signal of said third potential in the drain or source region of said third transistor when said third transistor is in an ON-state.

17. The memory according to claim 13, wherein
said third transistor connected to said first signal line arranged for said word line group including said selected word line is controlled to enter an OFF-state in data reading.

18. The memory according to claim 13, wherein
said third transistor connected to said first signal line arranged for said word line group other than said word line group including said selected word line is controlled to enter an ON-state in data reading.

* * * * *